United States Patent
Yunt et al.

(10) Patent No.: US 9,104,805 B1
(45) Date of Patent: Aug. 11, 2015

(54) METHOD FOR USING A GRAPHICAL DEBUGGING TOOL

(75) Inventors: Mehmet Yunt, Natick, MA (US);
Murali Yeddanapudi, Watertown, MA (US); Sanjai Singh, Bangalore (IN);
John Edward Ciolfi, Wellesley, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 13/408,463

(22) Filed: Feb. 29, 2012

Related U.S. Application Data

(63) Continuation of application No. 12/828,555, filed on Jul. 1, 2010, now Pat. No. 8,131,523, which is a continuation of application No. 10/733,788, filed on Dec. 10, 2003, now Pat. No. 7,774,172.

(51) Int. Cl.
*G06F 7/60* (2006.01)
*G06F 17/10* (2006.01)
*G06F 9/44* (2006.01)
*G06F 11/36* (2006.01)
*G06F 17/50* (2006.01)

(52) U.S. Cl.
CPC ........ *G06F 11/3664* (2013.01); *G06F 17/5009* (2013.01); *G06F 8/34* (2013.01); *G06F 8/35* (2013.01)

(58) Field of Classification Search
CPC ... G06F 11/3664; G06F 17/5009; G06F 8/34; G06F 8/35
USPC .......................................................... 703/2
See application file for complete search history.

(56) References Cited

U.S. PATENT DOCUMENTS

| | | | |
|---|---|---|---|
| 5,301,336 | A | 4/1994 | Kodosky et al. |
| 6,105,124 | A | 8/2000 | Farber et al. |
| 7,107,578 | B1 | 9/2006 | Alpern |
| 7,464,373 | B1 | 12/2008 | Yunt et al. |
| 2003/0084375 | A1 | 5/2003 | Moore et al. |
| 2004/0078780 | A1 | 4/2004 | Dutt et al. |
| 2005/0125808 | A1 | 6/2005 | Izurieta |
| 2007/0277151 | A1 | 11/2007 | Brunel et al. |

OTHER PUBLICATIONS

Simulink, "Simulink Model-Based and System-Based Design—Using Simulink", Version 5, Jul. 2002, 476 pages.*

(Continued)

*Primary Examiner* — David Silver
(74) *Attorney, Agent, or Firm* — Cesari and McKenna, LLP; Michael R. Reinemann

(57) ABSTRACT

A system and method of exposing debugging information in a graphical modeling and execution environment is disclosed. The present invention allows a user to view debugging information in the same window as the graphical view of the model being executed. Debugging data is associated with relevant components of the model displayed in the graphical view. A separate execution list view shows the methods called during the execution of the block diagram in the current time step up until the current point in execution. User-set breakpoints and conditional breakpoints may be set in both the model view and the execution list view. Values may be obtained for all of the displayed methods. The debugging tool may be implemented by using it in conjunction with a graphical modeling and execution environment, such as a block diagram environment or state diagram environment.

21 Claims, 29 Drawing Sheets

(56) References Cited

OTHER PUBLICATIONS

MathWorks, "Model-Based and System-Based Desgin—Using Simulink—Version 5", Copyright 2004, 488 pages.*

Fenlason, Jay et al., "GNU gprof, The GNU Profiler," retrieved online at http://www.cs.utah.edu/deptiold/texinfo/as/gprof_toc.html, 25 pages, (1993).

MathWorks, "SIMULINK, Dynamic System Simulation for MATLAB, Target Language Compiler Reference Guide, Version 1," The MathWorks Inc., 282 pages, (1997).

MathWorks, "Simulink, Dynamic System Simulation for MATLAB, Using Simulink, Version 2.2," The MathWorks, 645 pages (1998).

Fenalson, Jay, et al., "GNU gprof: The GNU Profiler," Free Software Foundation, Inc., 1998, pp. 1-44.

Fenalson, Jay, et al., "GNU gprof: The GNU Profiler," Free Software Foundation, Inc., 2000, pp. 1-44.

"Real-Time Workshop: For Use with SIMULINK," User's Guide, Version 2.1, Jan. 1998, pp. 1-285.

"Real-Time Workshop: For Use with SIMULINK," User's Guide, Version 5, Jul. 2002, pp. 1-590.

"SIMULINK: Dynamic System Simulation for MATLAB," Target Language Compiler Reference Guide, Version 1, May 1997, pp. 1-282.

"SIMULINK: Model-Based and System-Based Design," Using Simulink, Version 5, Jul. 2002, pp. 1-476.

"SIMULINK: Model-Based and System-Based Design," Using Simulink, Version 4, Apr. 2003, pp. 1-838.

"Real-Time Workshop: User's Guide, Version 2.1," The MathWorks, Inc., May 1997, pp. 1-244.

"Real-Time Workshop for Use with SIMULINK: User's Guide, Version 2.2," The MathWorks, Inc., Online Version, Jan. 1998, pp. 1-285.

* cited by examiner

Sorted List:

0:0  Sine Wave 1
0:1  Sine Wave 2
0:2  Function-Call Generator
0:3  Function-Call Subsystem
0:4  Integrator
0:5  Gain (algebraic id 0#1)
0:6  Sum (algebraic variable for id 0#1)
0:7  Out1

| Method | | ID |
|---|---|---|
| ⊟ diagram. Simulate | ☐ | 0 |
| ⊞ diagram. Start | ☐ | 1 |
| ⊟ diagram. Initialize | ☐ | 6 |
|    ⊟ RootSystem. Initialize | ☐ | 7 |
|       Integrator. Initialize | ☐ | 8 |
| ⊞ diagram. Initialize. InvariantConstants | ☐ | 9 |
|    diagram. Enable | ☐ | 11 |
| ⊞ diagram. Outputs. InvariantConstants | ☐ | 12 |
| ⊟ diagram. SimulationLoop | ☐ | 14 |
|    ⊟ diagram. Outputs. Major | ☐ | 15 |
|       ⊟ RootSystem. Outputs | ☐ | 16 |
|          Integrator. Outputs | ☑ | 17 |
|          Abs. Outputs | ☐ | 18 |
|          Outport. Outputs | ☐ | 19 |
|          Sin. Outputs | ☐ | 20 |
|          Gain. Outputs | ☐ | 21 |
| ⊞ diagram. Update | ☐ | 22 |
| ⊞ diagram. Solver | ☐ | 26 |
|    diagram. RequestSolverReset | ☐ | 143 |

*Fig. 18A*

```
[TM = 0.20000000000000038    ] diagram.Outputs.Major
(sidebug @15):
[TM = 0.20000000000000038    ] Entering 16  RootSystem.Outputs 'diagram'
[TM = 0.20000000000000038    ] Entering 17  0:0 Integrator.Outputs 'diagram/Integrator'
[TM = 0.20000000000000038    ] Exiting  17  0:0 Integrator.Outputs 'diagram/Integrator'
[TM = 0.20000000000000038    ] Entering 18  0:1 Abs.Outputs 'diagram/Abs'
[TM = 0.20000000000000038    ] Exiting  18  0:1 Abs.Outputs 'diagram/Abs'
[TM = 0.20000000000000038    ] Entering 19  0:2 Outport.Outputs 'diagram/Out1'
[TM = 0.20000000000000038    ] Exiting  19  0:2 Outport.Outputs 'diagram/Out1'
[TM = 0.20000000000000038    ] Entering 20  0:3 Sin.Outputs 'diagram/Sine Wave'
[TM = 0.20000000000000038    ] Exiting  20  0:3 Sin.Outputs 'diagram/Sine Wave'
[TM = 0.20000000000000038    ] Entering 21  0:4 Gain.Outputs 'diagram/Gain'
[TM = 0.20000000000000038    ] Exiting  21  0:4 Gain.Outputs 'diagram/Gain'
[TM = 0.20000000000000038    ] Exiting  16  RootSystem.Outputs 'diagram'
[TM = 0.20000000000000038    ] Entering 15  diagram.Outputs.Major
%                                          ------%
[TM = 0.20000000000000038    ] Entering 22  diagram.Update
[TM = 0.20000000000000038    ] diagram.Update
(sidebug @22):
%
```

*Fig. 23*

METHOD FOR USING A GRAPHICAL DEBUGGING TOOL

RELATED APPLICATION

The present invention is a continuation of U.S. patent application Ser. No. 12/828,555, filed on Jul. 1, 2010, now U.S. Pat. No. 8,131,523, which is a continuation of U.S. patent application Ser. No. 10/733,788, filed Dec. 10, 2003, now U.S. Pat. No. 7,774,172, the contents of which are incorporated herein by reference.

FIELD OF THE INVENTION

The illustrative embodiment of the present invention relates generally to the debugging of executed models, and more particularly to graphically debugging models in an interactive manner in a modeling and execution environment.

RELATED APPLICATION

The present application is related to a pending United States Application filed herewith entitled "A System and Method for Using a Graphical Debugging Tool in a Modeling and Execution Environment".

BACKGROUND

Current design processes for engineered systems have led to the use of sophisticated methods to simulate the behavior of increasingly detailed models. Complexity and a greater level of detail increases the probability that unexpected and undesired behavior is introduced into the model either through modeling error or by the inappropriate use of the simulation/execution environment. For example, large models rely on compositionality principles to manage their size. These models are frequently designed in separate pieces. In some cases, piecing together separately designed, functionally correct parts of a model results in aberrant behavior of the combination. Another example of unexpected and undesired model behavior is a severe slow-down in continuous time simulation due to the repeated use of very small step sizes that may be a result of incorrect or inefficient modeling of an engineered system.

It should be noted that during the discussion contained herein reference is made alternatively to the terms execution and simulation of a model. Those skilled in the art will recognize that block diagrams may be simulated and/or executed, while other types of models in a graphical modeling and execution environment such as state flow diagrams are executed. The term execution as used herein should be understood to also include the simulation of block diagrams.

To identify a cause when a model does not execute as expected, or when its execution time needs to be improved, detailed information about its execution has to be available. Unfortunately, this level of detail is not available as its display and accessibility introduces significant execution overhead. Instead, the model can be run in a distinct 'debug' mode, where the additional information is exposed, but at the cost of execution speed.

As an example, FIG. 1 shows a subsystem 1 designed to generate a particular pattern while another subsystem 3 produces a pattern that should be detected and locked when found. These subsystems can be designed independently, but when connected, unexpected behavior may result. In this model, a comparator 5 may fail to produce a logical one at times because the zero-crossing detection of the '==' operator does not 'step on' the point in time where the two values are exactly the same. Analyzed in debug mode, the actual values of the input and output of the '==' comparator block for each of the stages of the iterative zero-crossing detection can be studied. This shows that the iteration aborts when the inputs from the generator, U1, and the lock pattern, U2, are

U1=[1.1111111111111276]
U2=[1.1111111111111112]

Because these values are not exactly the same, the output of the comparator produces

Y1=[0].

Since the U1 and U2 values are within the tolerance of the zero-crossing detection mechanism, the exact equality is never achieved and the comparator never produces a logical one. Once the problem is identified, the model may be adjusted. For example, the model in FIG. 1 can be changed to use a dedicated hit-crossing block, crossing in which case the zero-crossing detection is more accurate and the comparison correctly identifies the equal patterns. The need for a sophisticated debug tool becomes even more apparent as the size of the model is increased.

Elements of a block diagram such as blocks, subsystems and the underlying model contain a collection of methods that are invoked by the execution engine at certain times during the simulation for different purposes, e.g., to generate an output, to update the state, and to compute derivatives. Because conventional debuggers expose only a small part of the entire set of methods that have to be invoked by the execution engine in order to execute a block diagram (e.g. the output method of blocks), users are only able to stop the execution of a block diagram at a block's output method and inspect data relevant to a block with respect to its output method. This is a major restriction in debugging a model's execution since the unexpected behavior may not be observable at a block's output method. Instead, the behavior may be related to a non-virtual subsystem method or one of the other types of methods, in which case displaying data at a block's output method is not helpful to the user. For example, the sort of problem illustrated in FIG. 1 could not be analyzed properly using conventional debugging tools in a graphical environment.

An additional drawback to conventional debugging systems is that in addition to stepping to the output method of the next block in a simulation order, the user can only step to the start of the next time step. As a result, the user does not have access to the majority of the computations executed during the simulation loop. Conventional debuggers also do not display the context in which a method is invoked, thus exacerbating the difficulty in analyzing the execution of a model. During one time step in simulation, the execution engine may invoke the output method of a block in various stages, e.g. during the calculation of model states, during calculation of model outputs and during zero-crossing detection. The present state of debugging tools does not allow the showing of any information regarding the context in which a method is executed. Accordingly, when the output method of a block is shown to be invoked, the user is unaware of which stage the simulation is in, and, therefore, the provided information about the output call is less useful.

In current debugging environments, the main graphical element is a graphical view of the block diagram, as designed by the user. As the user steps through an execution in the graphical view of the model, blocks related to the currently executing method may be indicated by a change of color. However, the block diagram as designed by the user may have been modified in a compilation stage before it is simulated. This compilation processes the block diagram by adding or removing non-graphical elements to optimize simulation. Since the debug information is relayed to the user only through the graphical elements of the original (pre-compiled) block diagram, critical simulation information embodied by the compiled version of the block diagram is not revealed to the user. The current type of graphical display generated by debugging tools does not contain any information on why blocks are indicated with a change of color and their relationship to the currently executing method.

Current model views shown during a debugging session do not contain any facilities to superimpose block output/input and internal data such as states, work vectors and derivatives onto the block diagram view. Instead, the user has to go to a command prompt to obtain relevant numerical data of a specific block. Not being able to see the relevant numerical data superimposed on the graphical topology as captured by the block diagram of the model during debugging is a major impediment to efficient debugging.

Conventional debugging methods also do not allow the user to interact with and affect the ongoing model simulation. The user cannot change or inject data into the model to test different scenarios while in a debugging session. Rather, the user first quits the debugging session, sets up the block diagram for a different scenario, and then restarts the debugger in order to test different scenarios.

Another issue with conventional methods of debugging is that it can only be used to debug simulations in interpreted mode. Interpreted mode processes code line by line without compiling it first. The model simulation must be run inside the execution engine. However, many applications of block diagram modeling result in the creation of standalone executables that run a block diagram simulation in a compiled mode of simulation. These executables also need to be debugged. At present, users do not have the capability to debug these standalone executables and see the run-time execution values on the block diagram.

BRIEF SUMMARY OF THE INVENTION

The illustrative embodiment of the present invention provides detailed execution information in a graphical modeling and execution environment by providing debugging information in a model view. The debugger displays all methods invoked during simulation and allows the user to have access to these methods; i.e., the user is able to interrupt execution before or after any method executes and is able to access any block data at these stops. In addition information related to solvers used in simulation of the model and profiling information are displayed and made available to the user. The user is also able to inject numerical data into the model to test different scenarios and as a result, alter the execution of the model. Additionally, compiled information may be superimposed onto the graphical model view of the block diagram. Changes coming from the compilation of the block diagram are indicated on the model view. The current chain of the executing methods is displayed on the model view as a series of pointers. The block data is made graphically available in the block diagram. In addition to the block diagram view, an execution list arranged in a tree view is displayed in a separate window and shows the methods called during model simulation. This execution list is dynamically updated as simulation continues. The user can locate the context in which a method executes on this view. The present invention also allows the debugger to communicate with standalone executables. This enables the block diagram code generators to incorporate functionality into standalone executables so that they can be debugged with the block diagram debugger.

In one embodiment, a method in a block diagram environment provides a model view and an execution list view to a display for a user to view. Both views are interfaced with a debugger for the model. The model view displays the parts of a model such as a block diagram. The execution list view depicts the execution order of methods called during simulation of the model. The state of the execution list is visually indicated on the model view.

In another embodiment in a graphical design environment, a system includes a model view, an execution list view and a debugger. The debugger gathers debug information from the simulation of a model and is interfaced with the model view and the execution list view. The model view displays the multiple parts of a model. The execution list view displays an execution list depicting the execution order of methods called during the execution of a time step of the model. The execution list view state is visually represented on the model view.

BRIEF DESCRIPTION OF THE DRAWINGS

FIG. 18A depicts a an execution list view;

FIG. 23 depicts a block diagram showing an execution history;

DETAILED DESCRIPTION

Figure 1:
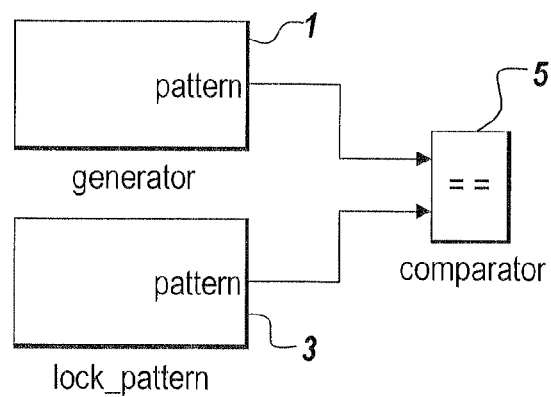
FIG. 1 is a block diagram of a subsystem with a pattern comparator (prior art)

The illustrative embodiment of the present invention allows a user to view debugging information in the same window as the graphical view of the model being simulated. Debugging data is associated with relevant parts of the model displayed in the graphical view. A separate execution list view shows the methods called during the simulation of the block diagram in the current time step up until the current point in simulation. User-set breakpoints and conditional breakpoints may be set in both the model view and the execution list view. The debugging tool may be implemented by using it in conjunction with a graphical design environment such as a block diagram environment, for example, Simulink™ from The MathWorks, Inc. of Natick, Mass.

For ease of explanation, references and examples herein discussing the modeling and execution environment are made to block diagrams being processed in a MATLAB™ and Simulink™-based environment. It should be understood however, that the present invention is equally applicable to a debugger operating in other graphical design environments operating on models other than block diagrams including state flow modeling, data-flow modeling, and three dimensional modeling environments.

Various classes of block diagrams describe computations that can be performed on application specific computational hardware, such as a computer, microcontroller, FPGA, and custom hardware. Classes of such block diagrams include time-based block diagrams such as those found within Simulink® from the MathWorks, Inc. Natick Ma, state-based and flow diagrams such as those found within Stateflow® from the MathWorks, Inc. Natick Ma., and data-flow diagrams. A common characteristic among these various forms of block diagrams is that they define semantics on how to execute the diagram.

Historically, engineers and scientists have utilized time-based block diagram models in numerous scientific areas such as Feedback Control Theory and Signal Processing to study, design, debug, and refine dynamic systems. Dynamic systems, which are characterized by the fact that their behaviors change over time, are representative of many real-world systems. Time-based block diagram modeling has become particularly attractive over the last few years with the advent of software packages such as Simulink from The MathWorks, Inc. of Natick, Mass. Such packages provide sophisticated software platforms with a rich suite of support tools that makes the analysis and design of dynamic systems efficient, methodical, and cost-effective.

A dynamic system (either natural or man-made) is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), bio-chemical systems (gene expression, protein pathways), weather and climate pattern systems, etc. Examples of man-made or engineered dynamic systems include: a bouncing ball, a spring with a mass tied on an end, automobiles, airplanes, control systems in major appliances, communication networks, audio signal processing, nuclear reactors, a stock market, etc. Professionals from diverse areas such as engineering, science, education, and economics build mathematical models of dynamic systems in order to better understand system behavior as it changes with the progression of time. The mathematical models aid in building "better" systems, where "better" may be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may also serve an educational purpose of educating others on the basic principles governing physical systems. The models and results are often used as a scientific communication medium between humans. The term "model-based design" is used to refer to the use of block diagram models in the development, analysis, and validation of dynamic systems.

Dynamic systems are typically modeled as sets of differential, difference, and/or algebraic equations. At any given instant of time, these equations may be viewed as relationships between the system's output response ("outputs"), the system's input stimuli ("inputs") at that time, the current state of the system, the system parameters, and time. The state of the system may be thought of as a numerical representation of the dynamically changing configuration of the system. For instance, in a physical system modeling a simple pendulum, the state may be viewed as the current position and velocity of the pendulum. Similarly, a signal-processing system that filters a signal would maintain a set of previous inputs as the state. The system parameters are the numerical representation of the static (unchanging) configuration of the system and may be viewed as constant coefficients in the system's equations. For the pendulum example, a parameter is the length of pendulum and for the filter example; a parameter is the values of the filter taps.

Figure 2A:
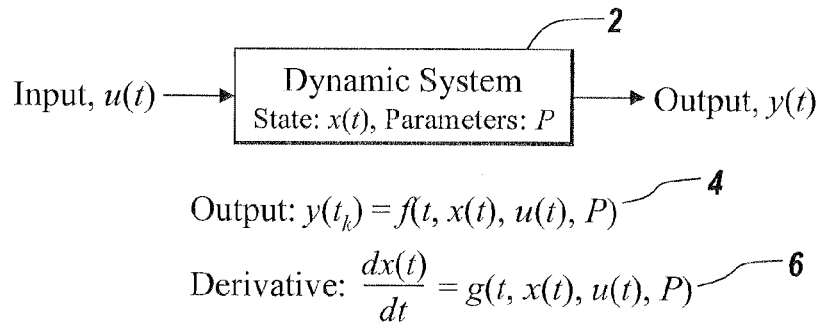
FIG. 2A depicts a dynamic system described with ordinary differential equations (ODE)

There are four common types of mathematical models used in the study of dynamic systems. The first type of mathematical model describes systems using ordinary differential equations (ODEs) and is depicted in FIG. 2A. The dynamic system 2 specifies a set of two equations: Output 4 and Derivative 6. The Output equation 4 facilitates the computation of the system's output response at a given time instant as a function of its inputs, states, parameters, and time. The Derivative equation 6 is an ordinary differential equation that allows the computation of the derivative of the states at the current time as a function of the inputs, the states, parameters, and time.

This class of models is suitable for systems in which it is important to track the system response as a continuous function of time. Such continuous-time systems are commonly representative of physical systems (mechanical, thermal, electrical). For simple systems, it may be possible to use the Output 4 and Derivative equations 6 to obtain a closed-form solution for the output response y(t). But in most complex real world systems, the response of the system is obtained by integrating the states through numerical means.

The definition of an ODE used herein encompasses both implicit and explicit differential equations. The class of ordinary differential equations may require additional equations to define the system being modeled. For example, equations called projections may be required to impose constraints on the differential variables (e.g., states $X_1$ and $X_2$ must fall on the manifold defined by $X_1^2 + X_2^2 = 25$). These constraints can be either applied as a secondary condition or a coupled condition to the differential equation. Although systems including the projections may conventionally no longer qualify as an ODE; they are included here to simplify the categories of systems. Another example is the use of a Jacobian equation that defines partial derivatives with respect to the independent and/or differential variables. The Jacobian equation is typically used when obtaining a linear approximation of a nonlinear model or an overall linear model of a set of equations. Jacobian equations are required for some forms of numerical integration, for producing the linear model once the model has reached its steady state operating point, etc. The Output 4 and Derivatives equations 6 may be extended to define other relationships for the block. For example, the Output equation 4 may help manage its states by defining a relationship where it resets the state back to a known quantity at a specific point in time or when a specific condition is seen.

Figure 2B:
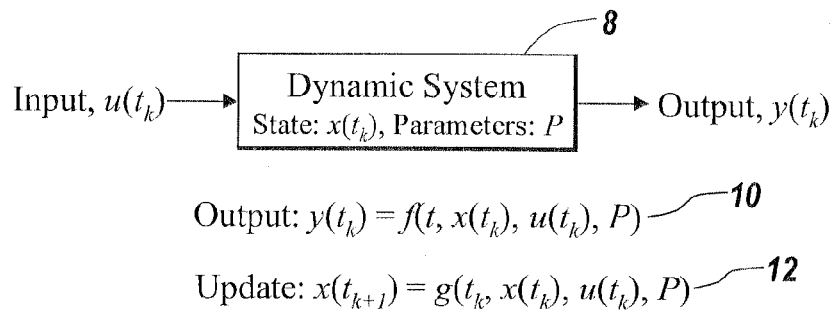
FIG. 2B depicts a dynamic system described with difference equations.

Another type of mathematical model describes systems using difference equations as depicted in FIG. 2B. The dynamic system 8 specifies a set of two equations: Output 10 and Update 12. The Output equation 10 facilitates the computation of the system's output response at a given time instant as a function of the inputs, states at some previous time, parameters, and time. The Update equation 12 is a difference equation that allows the computation of the states at the current time as a function of the inputs, states at some previous time, parameters, and time. This class of models is suitable for systems in which it is important to track the system response at discrete points in time. Such discrete-time systems are commonly representative of discrete-time control and digital signal processing systems. For simple systems, it may be possible to use the Output 10 and Update equations 12 to obtain a closed-form solution for the output response y(t). But in most complex real world systems, the response of the system is solved through recursion. The Output 10 and Update equations 12 are applied repeatedly to solve for the system response over a period of time.

Figure 2C:
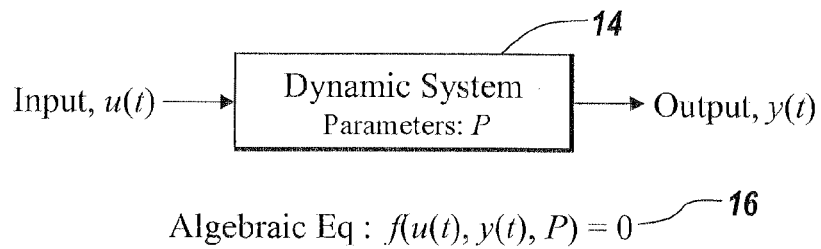
FIG. 2C depicts a dynamic system described with algebraic equations.

An additional type of mathematical model describes systems using algebraic equations as depicted in FIG. 2C. The dynamic system 14 uses an algebraic equation 16 that needs to be solved at each time to obtain the outputs. While simple systems may allow one to obtain a closed-form solution for the system inputs and outputs, practical algebraic equations may best be solved iteratively using a numerical method involving both perturbations and iterations. Algebraic equation solving techniques used in the context of dynamic system modeling are discussed in greater detail below.

A fourth type of mathematical model is a composite system that has components that fall into the three types of models discussed above. Most complex real-world system models fall into this category. This class of systems has Output, Derivative, Update, and potentially other equations. Solving for the output response of such systems requires a combination of the solution approaches discussed for all of the classes above. One example of a composite system is one described by differential-algebraic equations (DAEs) which contain both differential equations and algebraic equations. Grouped within the composite class of systems are many extensions involving relationships (equations) defined in terms of both outputs and state. For example, one can define a limited integration relationship for a differential variable. This relationship requires a set of equations that consists of the Output equation, an Update equation, a Derivative equation, and a Zero Crossing equation. The Zero Crossing equation defines the points in time where the upper and lower limits of the limited integration occur. Another example of an extension is the notion of Enable and Disable equations that define relationships among states or signals when parts of a system are activated and deactivated during execution.

Inherent in the four classes of systems (ODE, difference equations, algebraic equations and composite) is the notion of system sample time. The sample-time is the time interval at which the inputs, state, or outputs (collectively referred to as the results) of the system are traced as time progresses. Based on sample times, a system can be described as a discrete-time system, continuous-time system and hybrid system.

A discrete-time system is a system in which the evolution of the system results are tracked at finite intervals of time. In the limit as the interval approaches zero, the discrete-time system becomes a continuous-time system. The intervals of time may be periodic or non-periodic. Sometimes, non-periodic rate systems are referred to as nonuniform rate systems meaning that there is no periodic rate at which the response can be tracked Nonuniform-rate systems can fall into the class of composite systems where an additional equation (GetTimeOfNextVarHit) defines when in the future the other equations associated with the system should be evaluated. A continuous-time system is a system in which the evolutions of the system results are continuously changing. Continuous-time signals change during numerical integration (minor time steps). An example of a continuous-time system is one described by an ODE. There can also be algebraic or composite continuous-time systems. A hybrid system is a system with both discrete-time and continuous-time elements.

If a system has only one sample time, it is said to be single-rate. If a system has multiple sample times, it is said to be multi-rate. Multi-rate systems can be evaluated (executed) using either a single-tasking form of execution or a multi-tasking form of execution. When multi-tasking execution is used, it conforms to rate monotonic scheduling principals as defined by Liu, C. L., and LAYLAND, J. W. *Scheduling Algorithms for Multiprogramming in a Hard-Real-Time Environment*. ACM 20, 1 (January 1973), 46-61. Systems may also be categorized by the type of numerical integration solver being used. A fixed-step system is one that uses a fixed-step solver. Fixed-step solvers typically use explicit methods to compute the next continuous state at fixed periodic intervals of time. A variable-step system is one that is using a variable-step solver. A variable-step solver can use either implicit or explicit methods to compute the next continuous state at non-periodic intervals of time. Generally, variable-step solvers use a form of error control to adjust the interval size such that the desired error tolerances are achieved.

In practice, except for the most basic systems, mathematical models for dynamic systems involve a complex set of mathematical transformations applied in some prescribed manner with the outputs of some transformations forming the inputs of others. Each elemental transformation may be viewed in isolation as a simple dynamic system falling into one of the categories listed above. Therefore, a complex dynamic system may be modeled as an interconnection of various simple dynamic systems. A schematic representation of such an interconnection that has evolved over the years is the block diagram. Such block diagram models have now become a standard means in textbooks, design papers, journal articles, and specifications to communicate the details of a dynamic system's behavior.

Figure 3:
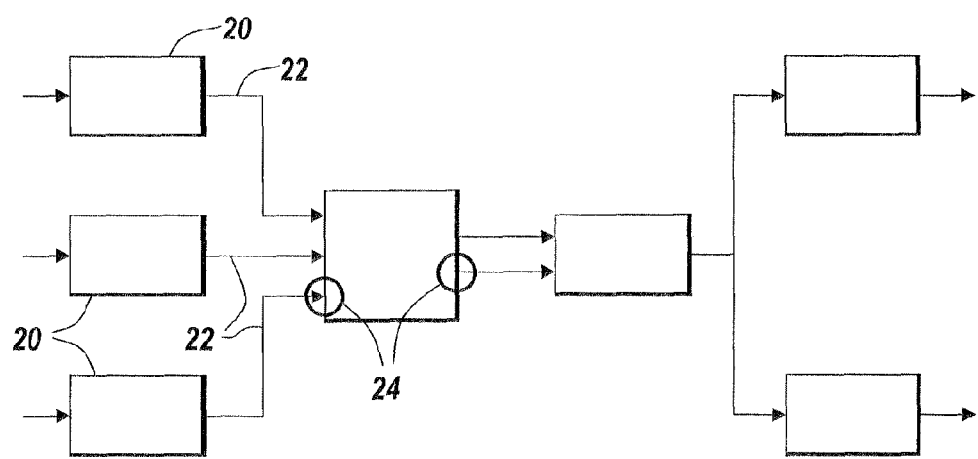
FIG. 3 depicts components of a basic block diagram.

A block diagram model of a dynamic system is represented schematically as a collection of blocks interconnected by lines that represent signals. A signal represents the input and output of a dynamic system. Each block represents an elemental dynamic system. A line emanating at one block and terminating at another signifies that the output of the first block is an input to the second block. Each distinct input or output on a block is referred to as a port. Signals correspond to the time-varying quantities represented by each line connection and are assumed to have values at each time instant. The source block of a signal writes to the signal at a given time instant when its system equations are solved. The destination blocks of this signal read from the signal when their system equations are being solved. The basic components of a block diagram are illustrated in FIG. 3. The block diagram includes a plurality of blocks 20, lines 22 and ports 24 that are interconnected. Those skilled in the art will recognize that the term "blocks" does not refer exclusively to elemental dynamic systems but may also include other modeling elements that aid in readability and modularity of block diagrams.

The theory of Digital Signal Processing (DSP) focuses on modeling signals as sequences of samples. This view naturally fits into the time-based block diagram paradigm by mapping the samples u[n] to discrete-time points $u(t_k)$. This adds the benefit of being able to model the interaction between DSP systems and other classes of time-based systems, e.g. continuous and/or discrete-time control systems.

Put another way, block diagram models are time-based relationships between signals and state variables representative of a dynamic system. The solution (computation of system response) of the model is obtained by evaluating these relationships over time, where time starts at a user-specified "start time" and ends at a user-specified "stop time". Each evaluation of these relationships is referred to as a time step. Signals represent quantities that change over time, and these quantities are defined for all points in time between the block diagram's start and stop time. The relationships between signals and state variables are defined by sets of equations represented by blocks. These equations define a relationship between the input signals, output signals, state, and time. Inherent in the definition is the notion of parameters, which are the coefficients of the equations.

It is important to note that block diagrams are not exclusively used for representing time-based dynamic systems but also for other models of computation. For instance, flowcharts are block diagrams used to capture process flow and are not generally suitable for describing dynamic system behavior. Data flow block diagrams are block diagrams that describe a graphical programming paradigm where the availability of data (often thought of as tokens) is used to initiate the execution of blocks, where a block represents an operation and a line represents execution dependency describing the direction of data flowing between blocks. As used herein, the term block diagrams means time-based block diagrams used in the context of dynamic systems except as otherwise noted.

Block diagram modeling has spawned a variety of software products such as Simulink from The Mathworks, Inc. of Natick, Mass., that cater to various aspects of dynamic system analysis and design. Such products allow users to perform various types of tasks including constructing system models through a user-interface that allows drafting block diagram models, allowing augmentation of a pre-defined set of blocks with custom user-specified blocks, the use of the block diagram model to compute and trace the temporal evolution of the dynamic system's outputs ("executing" the block diagram), and automatically producing either deployable software systems or descriptions of hardware systems that mimic the behavior of either the entire model or portions of it (referred to herein as "code generation"). Each of the tasks listed above has many intricate details and subtle variations which are explored further below.

Block modeling software includes a number of generic components. Although the discussion contained herein focuses on Simulink version 5.0 (Release 13) from the MathWorks, Inc. of, Natick Mass., those skilled in the art will recognize that it is applicable to other block modeling software applications. The generic components include a block diagram editor, blocks and a block diagram execution engine. The block diagram editor allows users to perform such actions as draw, edit, annotate, save, and print out block diagram representations of dynamic systems. As noted earlier, blocks are the fundamental mathematical elements of a classic block diagram model. Simulink extends the classic block diagram models by introducing the notion of two classes of blocks, non-virtual blocks and virtual blocks. Non-virtual blocks are elementary dynamic systems. A virtual block is provided for graphical organizational convenience and plays no role in the definition of the system of equations described by the block diagram model. Examples of virtual blocks are the Bus Creator virtual block and Bus Selector virtual block which are used to reduce block diagram clutter by managing groups of signals as a "bundle". Virtual blocks may be used to improve the readability of models. Simulink further extends the meaning of a non-virtual block to include other semantics, such as a "merge" block semantic. The merge block semantic is such that on a given time step its output is equal to the last block to write to an input of the merge block. An additional extension provided by Simulink is the concept of conditional execution. Simulink contains the concept of conditional and iterative subsystems that control when in time block methods execute for a sub-section of the overall block diagram.

A block diagram execution engine contributes to the modeling software task of enabling the computation and tracing of a dynamic system's outputs from its block diagram model. An execution engine carries out the task of compiling and linking the block diagram to produce an "in-memory executable" version of the model that is used for generating code and/or simulating or linearizing a block diagram model. Note that execution of the block-diagram is also referred to as simulation. The compile stage involves checking the integrity and validity of the block interconnections in the block diagram. In this stage, the engine also sorts the blocks in the block diagram into hierarchical lists that are used when creating the block method execution lists. In the link stage, the execution engine uses the result of the compiled stage to allocate memory needed for the execution of the various components of the block diagram. The linking stage also produces block method execution lists which are used by the simulation or linearization of the block diagram. Included within the link stage is the initialization of the model which consists of evaluating "setup" methods (e.g. block start, initialize, enable, and constant output methods). The block method execution lists are generated because the simulation and/or linearization of a model must execute block methods by type (not by block) when they have a sample hit.

After linking has been performed, the execution engine may generate code. In this stage, the execution engine may choose to translate the block diagram model (or portions of it) into either software modules or hardware descriptions (broadly termed code). If this stage is performed, then the stages that follow use the generated code during the execution of the block diagram. If this stage is skipped completely, then the execution engine uses an interpretive mode of execution for the block diagram. In some cases, the user may not proceed further with the execution of the block diagram because they would like to deploy the code outside the confines of the block diagram software. Upon reaching the simulation stage, the execution engine uses a simulation loop to execute block methods in a pre-defined ordering upon a sample hit to produce the system responses they change with time.

For linearization, Simulink uses the block method execution lists in a prescribed fashion to produce a linear state space representation of the dynamic system described by the block diagram.

The block diagram editor is the graphical user interface (GUI) component that allows drafting of block diagram models by a user In Simulink, there is also a textual interface with a set of commands that allow interaction with the graphical editor. Using this textual interface, users may write special scripts that perform automatic editing operations on the block diagram. A user generally interacts with a set of windows that act as canvases for the model. There is generally more than one window for a model because models may be partitioned into multiple hierarchical levels through the use of subsystems.

Simulink also offers a variety of other GUI tools that improve the ability of users to build and manage large block diagrams. Examples of such GUIs include: (a) a Finder that helps find various objects such as blocks and lines within a block-diagram, (b) a Debugger that helps debug the execution of block-diagrams, (c) a Revision Control UI for managing multiple revisions of the block-diagram, and (d) a Profiler for viewing timing results while executing a block-diagram.

A typical base data-structure for a block may be written in C++ or equivalent data structures written in other languages may also be used. The major data fields of the block data structure fall into four categories, a graphical attributes field, a functional attributes field, a compiled attributes field and an execution data field.

Blocks in a block diagram may be virtual or non-virtual. The designation of a block as non-virtual indicates that it influence the equations in the mathematical model for the dynamic system. In the context of block diagram software, it is beneficial to include other virtual blocks that do not affect the equations in the dynamic system's model. Such blocks help improve the readability and modularity of the block diagram and wield no semantic influence on the mathematical model. Examples of such virtual blocks include virtual subsystems, inport blocks and outport blocks, bus creator blocks and From and Goto blocks.

Modularity may be achieved in a block diagram by layering the block diagram through the use of subsystems. A subsystem facilitates layering by allowing a collection of blocks to be represented by a single block with input and output signals. The input and output signals of the subsystem are accessible to the constituent blocks within the subsystem. A subsystem is a virtual subsystem if its constituent blocks are moved back into the main block diagram model during the model's execution. Within a virtual subsystem graphical entities, called inport and outport blocks, are provided to define signal connections to the parent block diagram. These inport and outport blocks indicate a tunnel-through signal connection to the parent block diagram.

Simulink also provides the user with the ability to extend the simulator by providing the ability to enhance the simulator with blocks that define dynamic systems or are virtual properties. The extension is provided through a language independent API (e.g. C, C++, Ada, Fortran, Assembly, M).

As noted previously, to facilitate modeling fairly large and complex dynamic systems, Simulink allows users to layer their block diagrams. A subsystem facilitates such layering by allowing a collection of blocks to be represented by a single block with input and output signals. The input and output signals of the subsystem are accessible to its constituent blocks. By nesting subsystems within each other, one can create block diagrams with arbitrary layers of hierarchy. Ideally a subsystem has no impact on the meaning of the block diagram. Additionally, subsystems provide a way of grouping blocks together and allowing other block diagram constructs to impose unified control on the constituent blocks. To enhance the modularity of subsystems, modeling software also allows aggregated list(s) of parameters of the blocks within the subsystem to be accessed from a single GUI, and defines and displays special icons on the subsystems. The process of defining the parameter list and the special icon is called masking a subsystem.

There are two main types of subsystem blocks, virtual subsystems and non-virtual subsystems. Virtual subsystems serve the purpose of providing the block diagram with a graphical hierarchy. Non-virtual subsystems behave like an elemental dynamic system with its own execution methods (Output, Update, Derivatives, etc.). These execution methods in turn call the execution methods of the constituent blocks. The classes of non-virtual subsystems are:

Atomic subsystems. These are similar to virtual subsystems, with the advantage of grouping functional aspects of models at a given layer. This is useful in modular design.

Conditionally-executed subsystems. These are non-virtual subsystems that execute only when a precondition is fulfilled:

Enabled subsystems. These are similar to Atomic subsystems, except that the constituent blocks only execute when an enable signal feeding the subsystem is greater than zero.

Triggered subsystems. These are similar to Atomic subsystems, except that the constituent blocks only execute when a rising and/or falling signal is seen on a triggering signal feeding the subsystem.

Enable with Trigger subsystems. These are an intersection of the properties of Enabled and Triggered subsystems.

Action subsystems. These subsystems are connected to action-initiator (e.g., an "If" or "SwitchCase" block), a block that explicitly commands the subsystem contents to execute. These subsystems are similar to Enabled subsystems except that the management of the "enabling" signal has been delegated to an action-initiator. Action subsystems define a new type of signal, called an action signal that signifies which subsystems are commanded to execute by the action-initiator.

Function-call subsystems. These subsystems provide a means of collecting blocks into a subsystem that is only executed when called by an owner block. The owner block may compute input signals for the subsystem before calling the subsystem. Additionally, the owner may also read output signals from the subsystem after calling it. Function-call subsystems define a new type of execution control signal, called a function-call signal that contains no data. It is used to define the execution relationship between the owner block and the function-call subsystem. Function-call owners may also designate themselves as an "interrupt" source. In simulation, they simulate the effects of an interrupt and in code generation they can attach themselves to an (asynchronous) interrupt.

While subsystems and For subsystems. These subsystems execute the constituent blocks multiple times on a given time step.

Simulink allows for several forms of block parameters to be defined. There are two general categories of parameters: those parameters that can be modified during simulation and those that cannot be modified. An example of a parameter that may be modified during simulation is the amplitude of a Sine Wave block if configured by the user to allow modification during execution. A parameter such as the amplitude specifies coefficients of the dynamic equation, in this case the amplitude of the sine wave function defined by the Sine Wave block. An example of a parameter that can never be modified during simulation is the sample time of the Sine Wave block. The parameters that can be modified during simulation are further broken down into other categories which include mapping the dialog parameter (e.g. the amplitude) to run-time parameters or converting the dialog parameter to an inlined (non-modifiable) parameter. Run-time parameters can further be mapped to mathematical expressions of tunable Matlab variables or Matlab parameter objects describing properties of the variables (called Simulink.Parameter's). A global run-time parameter data structure is used within Simulink to manage the block parameters during the execution of the model.

In addition to block parameters, there are model-wide parameters which are generally associated with the solver. These parameters include aspects such as the time span in which to perform a simulation, the type of solver, and the time span. Simulink gives the user the ability to adjust solver parameters during model execution. The adjustment of these solver parameters is performed at the start of a time step.

Figure 4:
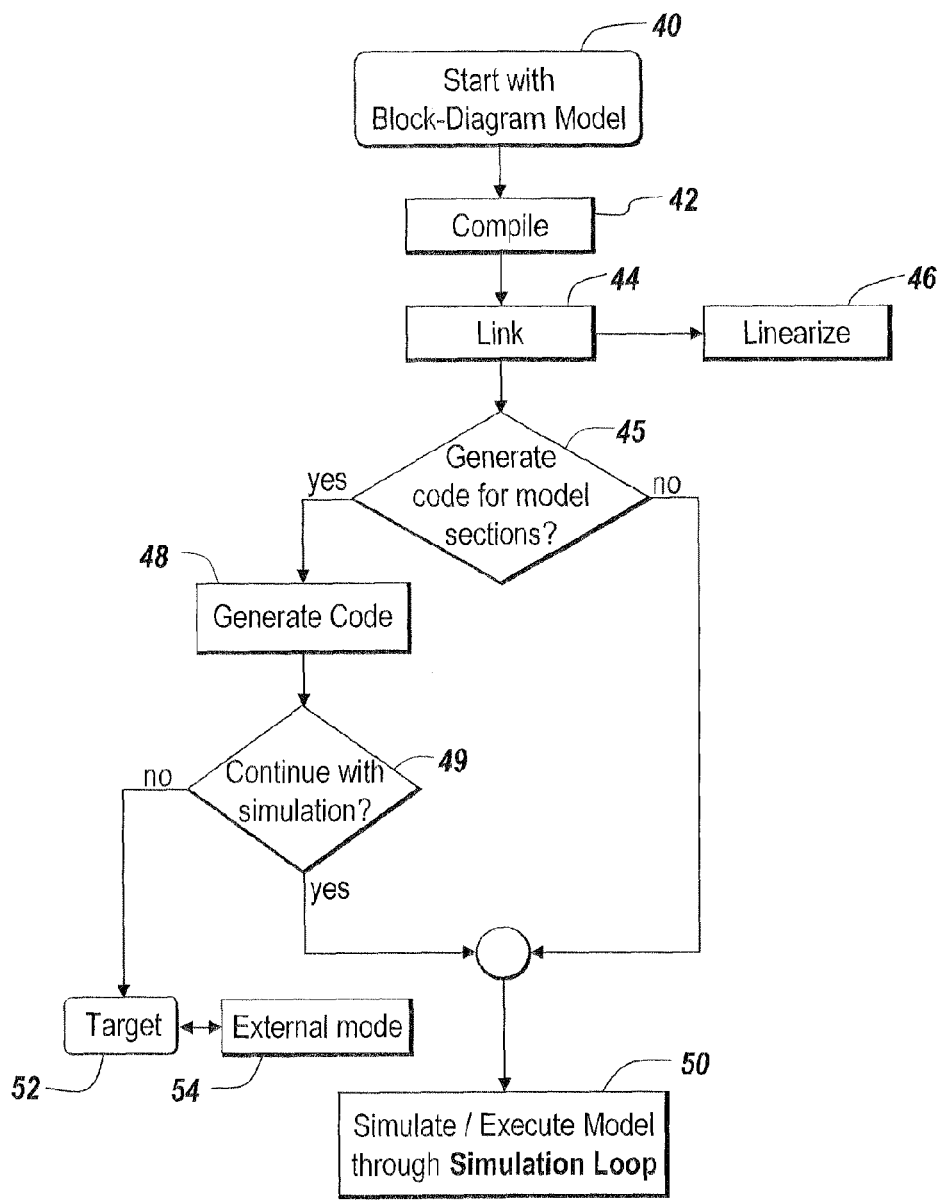
FIG. 4 is a flow chart of the sequence of steps used to perform simulation of the block diagram.

Once a block diagram model has been constructed using the editor, an execution engine allows the model to be solved in order to trace the system outputs as a function of time. The solution of the model, which may be referred to as model execution, is carried out over a user-specified time span for a set of user-specified inputs. Simulation proceeds in four major stages: compilation, link, code generation, and the simulation loop. Alternatively, the execution engine can obtain a linear representation of the model (linearization). The interrelationship between the various stages is illustrated in a flowchart in FIG. 4.

The execution begins when the block diagram 40 is compiled 42. Following the compilation stage, is the model link stage 44 which may also produce linear models 46. Code may or may not be generated 45. If code is generated 48, a decision is made 49 whether to continue the simulation. If the decision is made to continue the simulation the model is simulated/executed through the Simulation Loop 50. If the simulation is not continued, the code may be delivered to a target 52 and executed in an external mode 54. If code is not generated the block diagram may execute in interpretive mode when entering the Simulation Loop 50.

The compile stage marks the start of model execution and involves preparing data structures and evaluating parameters, configuring and propagating block characteristics, determining block connectivity, and performing block reduction and block insertion. The preparation of data structures and the evaluation of parameters creates and initializes basic data-structures needed in the compile stage. For each of the blocks, a method forces the block to evaluate all of its parameters. This method is called for all blocks in the block diagram. If there are any unresolved parameters, execution errors are thrown at this point.

During the configuration and propagation of block and port/signal characteristics, the compiled attributes (such as dimensions, datatypes, complexity, or sample time) of each block (and/or ports) are setup on the basis of the corresponding functional attributes and the attributes of blocks (and/or ports) that are connected to the given block through lines. The attribute setup is performed through a process during which block functional attributes "ripple through" the block diagram from one block to the next following signal connectivity. This process (referred to herein as "propagation"), serves two purposes. In the case of a block that has explicitly specified its block (or its ports') functional attributes, propagation helps ensure that the attributes of this block are compatible with the attributes of the blocks connected to it. If not, an error is issued. For instance, if an Integrator block is implemented to only accept numbers of double precision datatype, then this block will error out if it is driven by a block that produces single precision data, unless the user has asked for an implicit data conversion. Secondly, in many cases blocks are implemented to be compatible with a wide range of attributes. Such blocks adapt their behavior in accordance with the attributes of the blocks connected to them. This is akin to the concept of polymorphism in object-oriented programming languages. For instance, a discrete-time Filter block could be implemented to accept any of the standard integer datatypes ranging from 8-bit to 128-bit. The exact implementation of the block is chosen on the basis of the specific block diagram in which this block finds itself. Included within this step are other aspects such as validating that all rate-transitions within the model yield deterministic results and that the appropriate rate transition blocks are being used.

Figure 5:
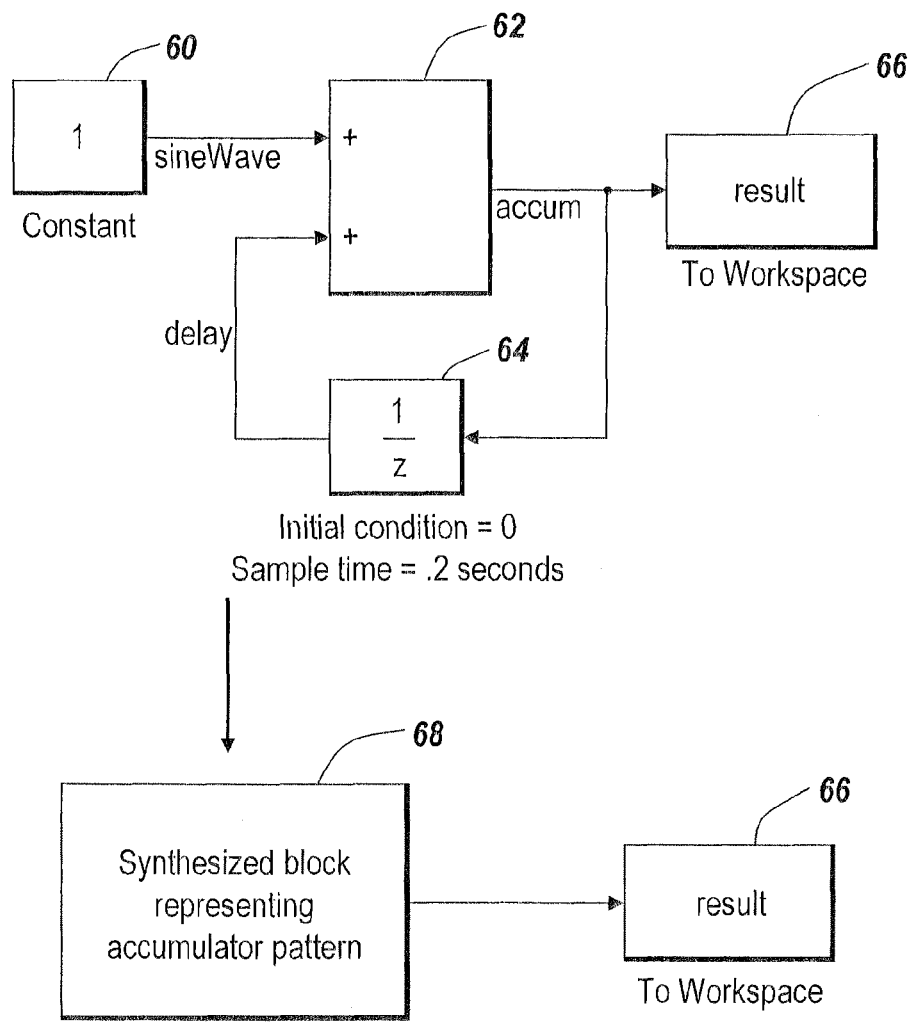
FIG. 5 depicts the replacement of a collection of blocks in a block diagram with an accumulator block.

The compilation step also determines actual block connectivity. Virtual blocks play no semantic role in the execution of a block diagram. In this step, the virtual blocks in the block diagram are optimized away (removed) and the remaining non-virtual blocks are reconnected to each other appropriately. This compiled version of the block diagram with actual block connections is used from this point forward in the execution process Once actual block connectivity has been determined (by removing the virtual blocks) the block diagram may be further optimized by performing block reduction and insertion. During this step, non-virtual blocks may be inserted or a set of non-virtual blocks may be completely removed or reduced to a single equivalent block. Block insertion and reduction is mainly done to improve execution efficiency. Examples of block insertion and reduction include the removal of Gain blocks whose gain value is 1. A Gain block is a block which multiplies its input value by a gain parameter, such as a simple amplifier. FIG. 5 depicts the replacement of a collection of blocks 60, 62, and 64 connected in a accumulator pattern and leading to result 66 with an equivalent synthesized block 68 representing the accumulator pattern leading to the same result 66. A signal copy block may also be automatically inserted in order to make contiguous memory copies of signals that are made up of disjoint memory sections. Block insertion and reduction may also be performed at other suitable stages of compilation.

The way in which blocks are interconnected in the block diagram does not necessarily define the order in which the equations (methods) corresponding to the individual blocks will be solved (executed). The actual order is partially determined during the sorting step in compilation. Once the compilation step has completed, the sorted order cannot be changed for the entire duration of the block diagram's execution.

The first step in sorting involves transforming the graphical block diagram into a compiled (in-memory) directed graph consisting of arcs and vertices. The vertices are derived from some of the non-virtual blocks. For instance, virtual and reduced blocks do not appear in the directed graph. The arcs represent data dependencies between the vertices. The data dependencies do not correspond to the signals in the block diagram. For example, all signals that connect to input ports without direct feed through are "cut" or ignored. In addition, data dependencies are added to capture implicit dependencies. For example, all inputs to a Function-Call subsystem are implicit data dependencies to the owner (caller) block.

Figure 6A:
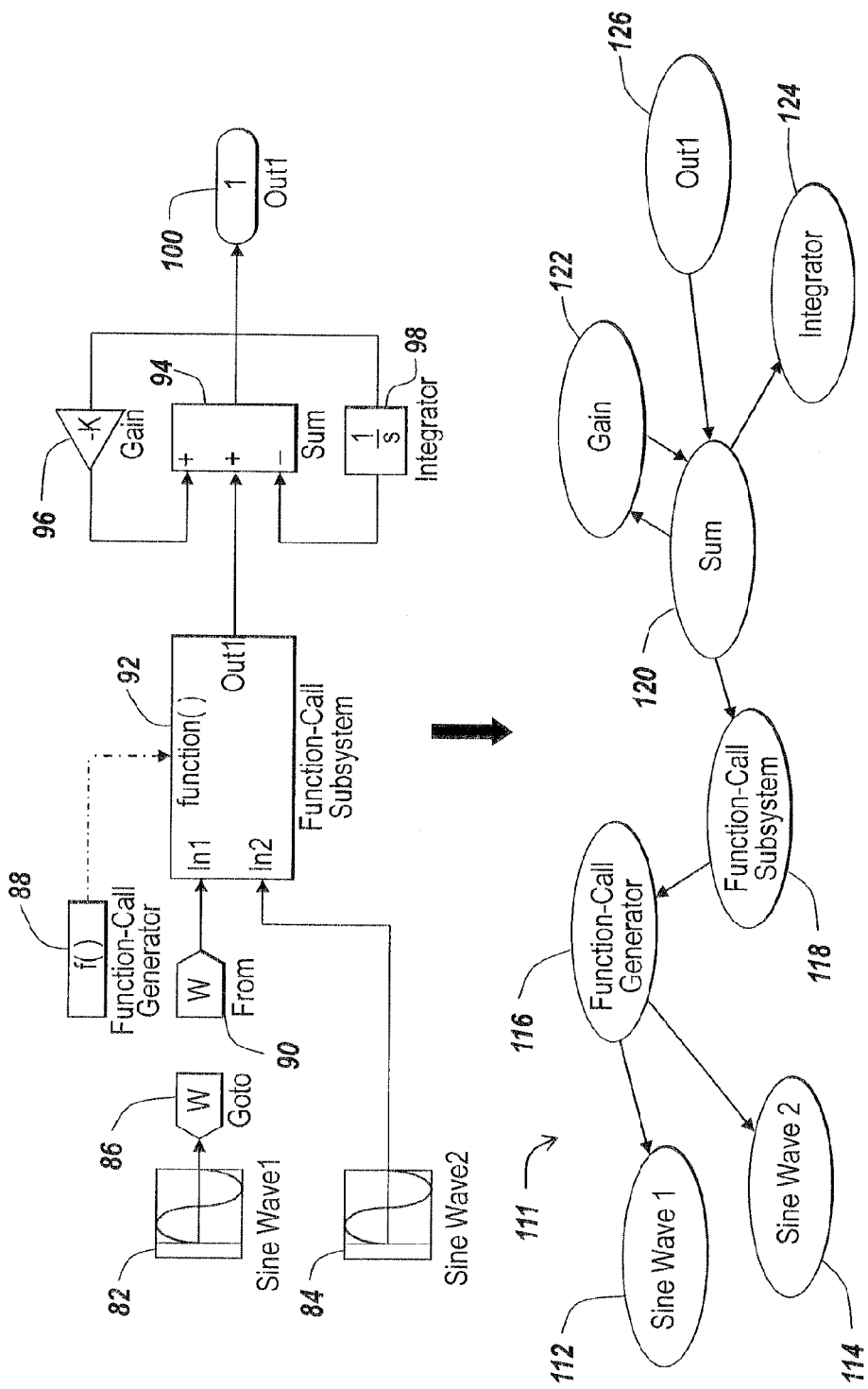
FIG. 6A depicts a block diagram and its associated directed graph.

The process of converting a block diagram into a compiled directed graph is shown in FIG. 6A. A block diagram 81 includes a Sine Wave 1 block 82, a Sine Wave 2 block 84, a Goto block 86, a Function Call Generator block 88, and a From block 90. Also included are a Function Call Subsystem block 92, a Sum block 94, a Gain block 96, an Integrator block 98 and an Outport (Output 1) block 100. Those blocks which are not virtual or reduced appear on the corresponding directed graph 111. The directed graph 111 includes a Sine Wave 1 vertice 112, a Sine Wave 2 vertice 114, a function-call generator vertice 116, and a function call subsystem vertice 118. Also included are a Sum vertice 120, a Gain vertice 122, an Integrator vertice 124 and an Outport 1 vertice 126. The vertices are connected by arcs.

Figure 6B:
FIG. 6B depicts a linear sorted list generated from the directed graph of FIG. 6A.

The graph is used to sort the blocks into a linear sorted list. FIG. 6B depicts a sorted list 128 generated from the compiled directed graph 111 which includes the elements appearing as vertices in the directed graph 111 sorted into order. The root block diagram has a sorted-list associated with it. Roughly speaking, each non-virtual subsystem layer and some special block diagram elements also each have their own sorted-list. During the sorting of the graph into the list, strongly connected components are identified. The term strongly connected section, which is a term that originates from graph theory, is a subset, S, of the blocks of a block diagram such that any block in S is reachable from any other block in S by following signal connections and S is not a subset of any larger such set. Strongly connected sections are flagged as algebraic loops when all blocks have direct feedthrough (an example is shown in FIG. 6A consisting of the Sum 120 and Gain 122 blocks). Such loops correspond to a set of algebraic equations and are solved using iterations and perturbations during block diagram execution by solving for the algebraic variables. Algebraic variables are either specified by the user via Initial Condition blocks or chosen by the execution engine. Solving of algebraic loops is discussed further below.

Sorting must also take into consideration other user specified dependencies between the blocks. These dependencies include the concepts of priorities and placement groups. A block priority specifies the order in which the equations associated with a block are evaluated with respect to other blocks. Placement groups are a way of causing each class of block methods for a specified set of blocks to be "placed together" in the block method execution lists. The terms "data dependency" or "data precedence" as used herein refers to the arcs of the compiled directed graph and not the signals found within a block diagram. Attempting to correlate data dependencies directly to the signals found within a block diagram is incorrect and leads to the conclusion that Simulink does not satisfy data dependencies, i.e., the execution of the operations or block methods does not satisfy data dependencies if one interprets signal connectivity as specifying data dependencies.

After compilation, the link stage commences. During this stage physical memory allocations are made in order to prepare for execution. Buffers are allocated for block input and output data buffers, states, and work areas. Additionally, block method execution lists that are derived from the sorted list allow for execution of the block diagram. Each block method execution list is a list of block methods that are to be executed in a sequence when each method within the list has a sample hit. There is generally a set of block method execution lists associated with each layer of the block diagram that corresponds to a non-virtual subsystem. Non-virtual subsystems are either defined by the user or automatically synthesized during compilation to either efficiently execute the model or simplify the implementation of the semantics defined by Simulink. In multi-tasking mode, the lists within each layer may be further partitioned when block diagrams have blocks with different sample rates. These lists are explained in greater detail below.

Those skilled in the art will recognize that while the block method execution lists are derived from the sorted list, they do not necessarily correspond one-to-one with the sorted lists. First, each block method execution lists contains only blocks that have such a block method of the given type (class) defined by the list. Second, block methods corresponding to components like the function-call subsystem do not appear on the block method execution lists because they are executed by an "owner" block.

Although included in the discussion of the compilation stage, it is not required that the time-based diagram perform the block sorting step during compilation. The sorting step is performed to achieve efficient execution. Ignoring efficiency, there is no semantic reason to perform the sorting step. Any random ordering of the block methods will work. In fact, any ordering of all block method execution lists except the Output block method execution list will result in the same level of efficiency. Randomly re-ordering the Output block method execution list will yield correct answers. If the Output block method list is randomly ordered, then the Simulation engine, when executing the Output block method execution list, continues sequencing through the Output block method execution list at each point in time until there are no changes.

Similarly included within the linking stage for the sake of simplicity, is the memory initialization of the model. The memory initialization of the model includes invoking block start, initialize, constant initialize, enable, and constant output methods. These are examples of some of the block methods that are used during model setup (prior to execution) to initialize the "state" of the system so that execution or linearization can commence.

The compiled and linked version of the block diagram may be directly utilized to execute the model over the desired time-span. This interpretive mode of execution is suitable for getting fine-grained signal traceability. It should be noted that the traceability associated with interpretive execution comes at the price of increased overhead in the form of additional execution-related data-structures and messaging in the engine. An alternative to the interpretive execution mode is to utilize the generated-code created by Real-Time Workshop tool for Simulink models. In this mode, the engine (upon the behest of the user) translates a selected portion of the block diagram (or the entire block diagram itself) into code. Such code could be in a number of possible forms. The code may be instructions in a high-level software language such as C, C++, Ada, etc., hardware descriptions of the block diagram portions in a language such as HDL, or custom code formats suitable for interpretation in some third-party software. Alternatively, the code may be instructions suitable for a hardware platform such as a microprocessor, microcontroller, or digital signal processor, etc., a platform independent assembly that can be re-targeted to other environments, or just-in-time code (instructions) that corresponds to sections of the block diagram for accelerated performance.

The execution of a portion of the block diagram represented in code may be performed in a number of different ways based on the specific code format. The portion of the block diagram may execute a compiled version of the code generated in a high-level language (accelerated or software-in-the-loop simulation), the execution may simulate code that corresponds to a hardware description on a hardware simulator, (co-simulation execution), the execution may involve calling out to third-party software to run code generated for such software (co-simulation execution), or the execution may call out directly to hardware that will run code that was generated and compiled for that hardware (processor-in-the-loop execution).

There are several different advantages to execution through code generation: Execution of generated code can be more efficient than interpretive execution because of fewer data-structures and lesser internal messaging in the engine, although the increased efficiency generally comes at the cost of decreased execution traceability. Simulation of hardware descriptions during execution can help identify and resolve bugs in the software stage of a design project. Such bugs prove much more expensive to track and fix once the system has been implemented in hardware. Additionally, block diagram modeling software can be integrated with other software environments that are suitable for modeling and simulating special classes of systems. Models can be tested directly in hardware thereby making prototyping of new systems fast and cost-effective. For instance, consider the design of a controller for an anti-lock braking system of a car. The dynamics of the braking system can be executed in the interpretive mode in the block diagram. The controller itself can be implemented on a hardware micro-controller to test the efficiency of the control laws implemented within. Note that for such target execution, it is normally necessary for the time span over which a model is executed by the software to match real-world time. In other words, the software must allow real-time execution of the block diagram model. Those skilled in the art will recognize that when users generate code, they may choose to not proceed further with the block diagram's execution. They may choose to take the code and deploy it outside of the confines of the modeling software environment. This is normally the last step in the design of dynamic systems in a block diagram software package.

There are several forms of target code execution known to those skilled in the art such as Rapid Prototyping, Embedded System Deployment, and Hardware-in-the-Loop which execute a model or portions of a model via the generated code on a Real-Time System target. One aspect of deploying (executing) the generated code on a target is the notion of "external mode." External mode refers to a system where Simulink acts as a monitor and debugger of the generated code running in real-time on a target. In External Mode, users can change parameters and view signals via standard Simulink elements. Another important aspect of the code generation technology is that it is very extensible. Provided with the Simulink product family is the Target Language Compiler (TLC). This technology enables the creation of "active scripts" that control how the generated code is produced for a block diagram. Using TLC, one can tailor the generated code to suite their specific needs.

The execution of the block diagram uses a Simulation Loop (SimLoop) for solving for the block diagram's outputs for a specified set of inputs over a specified span of time ("Time" in reference to the Simulation Loop means the time-line corresponding to the tracing of the dynamic system's outputs, not real-world time unless otherwise noted). The term "Sim-Loop" applies to real-time systems where each iteration is tied to a physical periodic clock or other timer source. During this process, the block methods (equations) corresponding to the individual blocks are executed by type following their sorted order when they have a sample hit. The term "block execution" is loosely used to mean executing all block methods associated with the given block for a given time step, generally starting with the output method. Strictly speaking, blocks do not execute; the engine executes (evaluates) the appropriate block methods at the appropriate time points.

SimLoop has two variants "single-tasking" and "multi-tasking" depending on sample times. In general, the sample time of a block is the interval of time between calls to the Output, Update, and/or Derivative methods for a given block. In computing this interval, repeated calls at the same time instant (not in real-world time but the time corresponding to the execution of the dynamic system) are counted as the same call. A block's sample rate may also be thought of the interval between successive executions of the block methods. If there is no uniform or regular interval between calls, then the block is said have a continuous sample time. If a uniform time interval can be found, then the block is said to have a discrete sample—time equal to that interval. Although blocks may be associated with more than one sample time in a sufficiently complex dynamic system the descriptions contained herein are confined to blocks with a single sample-time. Those skilled in the art will recognize that the descriptions may be extended to encompass blocks with multiple sample times.

Figure 7A:
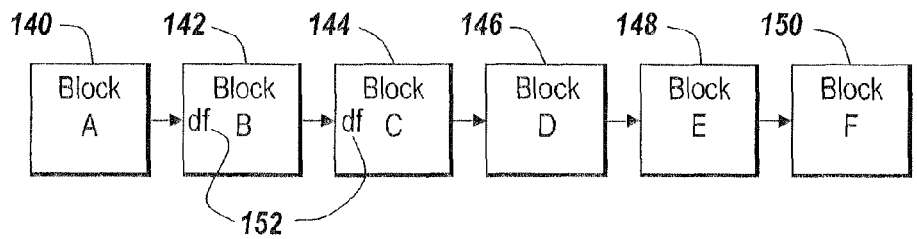
FIG. 7A depicts an abstract example of a block diagram being executed.
Figure 7B:
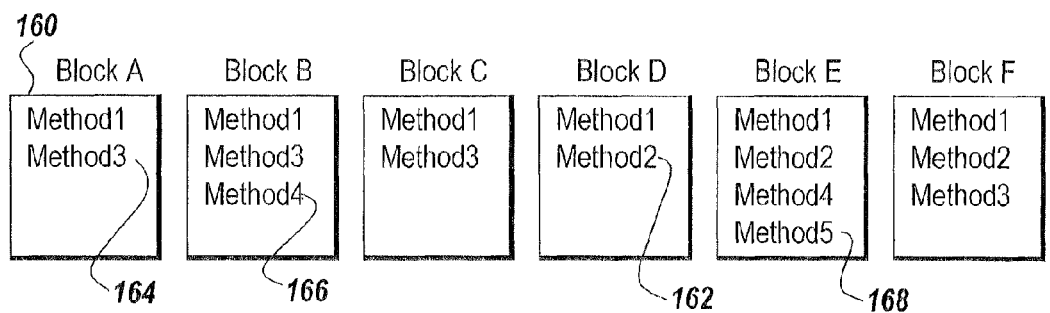
FIG. 7B depicts an abstract view of the execution methods instantiated by the blocks depicted in FIG. 7A.
Figure 7C:
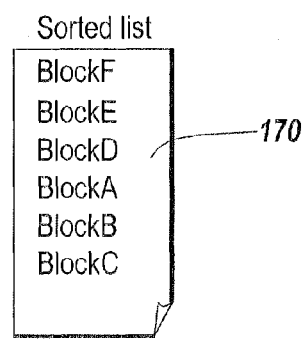
FIG. 7C depicts a sorted list generated from the data dependencies between blocks of FIG. 7A.

FIG. 7A depicts an abstract example of a block diagram being executed. The diagram includes a plurality of blocks 140, 142, 144, 146, 148 and 150. The block ports that have direct feedthrough are explicitly marked (using the symbol 'df') 152. Additionally, an abstract view of the execution methods instantiated by each block is shown in FIG. 7B. The blocks contain a number of different methods 160, 162, 164, 166 and 168. Execution methods includes the three basic execution methods discussed earlier: Output, Update, Derivative, as well as several other methods that aid in advanced block functions such as initialization, linearization and zero-crossing detection. (which are discussed below). The data-dependencies between the compiled vertices created during sorting are used to generate the Sorted List 170 shown in FIG. 7C.

Figure 8:
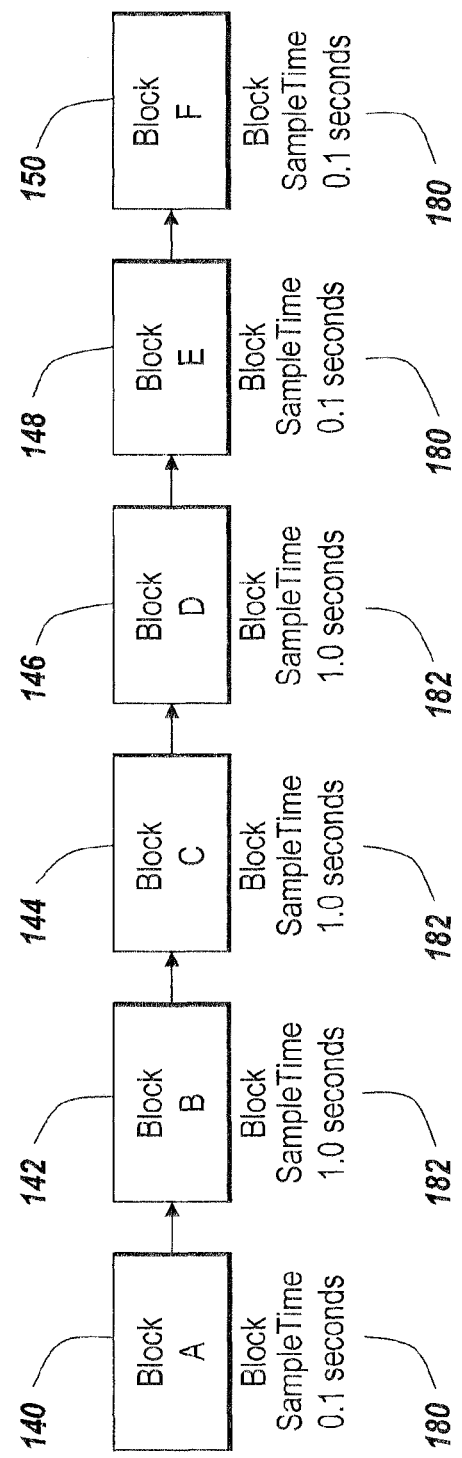
FIG. 8 depicts a multi-rate system.

A block diagram consisting of blocks that all have the same sample time is said to correspond to a single-rate system. A block diagram consisting of blocks that have more than one sample time corresponds to a multi-rate system. FIG. 8 depicts a multi-rate system, adding sample-time information to the block diagram of FIG. 7A. The plurality of blocks 140, 142, 144, 146, 148, and 150 each have an associated sample time. Since the sample times in the block diagram differ between blocks, the system is considered a multi-rate system. Block A 140, block E 148 and block F 150 each have a sample time of 0.1 seconds. Block B 142, block C 144 and block D 146 each have a sample time of 1.0 seconds.

The SimLoop is the heart of the execution engine. Each full pass through the loop is responsible for computing the outputs of the system at a particular time. At the end of each loop, the execution time corresponding to the next pass through the loop is computed. If this time exceeds the stop time specified by the user, the execution terminates. Within the loop, the sequence in which individual block equations are solved is determined by two pieces of information: the sample times of the blocks and the sorted order determined during the Compile stage. The amalgamation of these two pieces of information gives the execution lists for the block diagram. Those skilled in the art will recognize that the execution lists are created in the Link stage and are explained in the context of SimLoops for convenience. There are two distinct approaches for building execution lists and using them in the SimLoop. These approaches correspond to the Single-tasking and Multi-tasking SimLoops summarized in the discussion on FIG. 10 below.

Simulink also has the ability to modify coefficients (parameters) of blocks who declare their parameters as tunable. An example of a block is a Sine Wave block that implements the function output (time)=Amplitude*sin(frequency*time+phase)+bias, where time is the independent variable and the parameters are: amplitude, frequency, phase, bias. When these parameters are declared as tunable, Simulink lets the user change these coefficients during simulation. Changing parameters is a drastic operation in that the definition of the model has changed (e.g. the sine block defines equations that describe the system). Thus, to enable the changing of parameters during the SimLoop, Simulink first queues parameter changes and then applies them on the next time step. Thus, the changing of parameters is not immediate. The delay in the changing of parameters is needed to ensure system stability. The application of the parameters at the start of the next time step is combined with the reset of the solver (Integrator) if needed.

Figure 9:
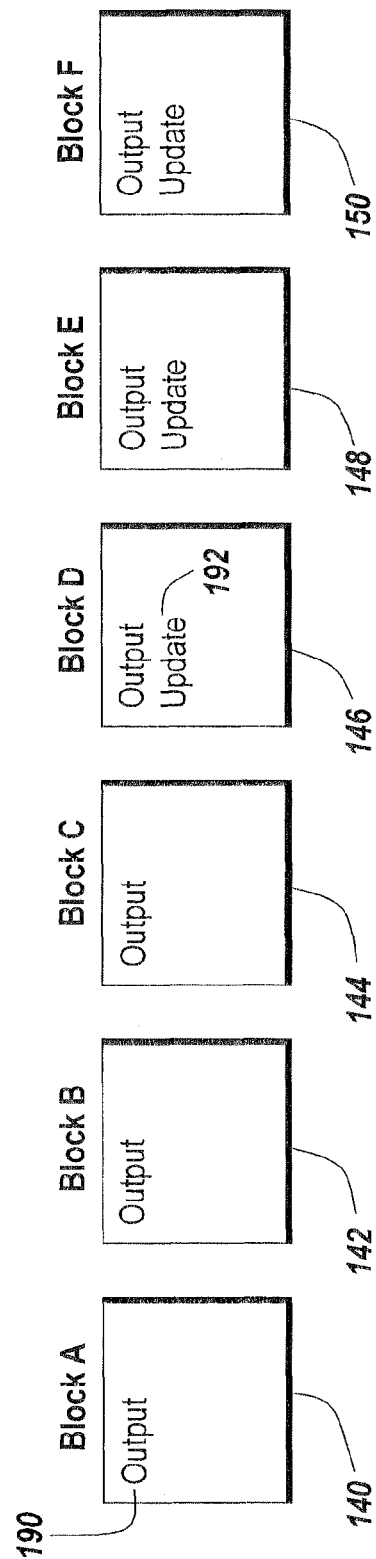
FIG. 9 depicts the block diagram of FIG. 7A and FIG. 8 with associated methods added to the blocks.

For the purpose of exploring single-task loops and multi-task loops, FIG. 9 depicts the block diagrams of FIG. 7A and FIG. 8 where Method1 corresponds to the Output method 190 and Method2 corresponds to the Update method 192. All other methods are ignored in the explanation of the loops. Simpler loops which do not include blocks that have continuous sample times are used in the example since the explanation is simpler in the context of discrete sample times and it is straight-forward to extend to continuous sample times.

Figure 10:
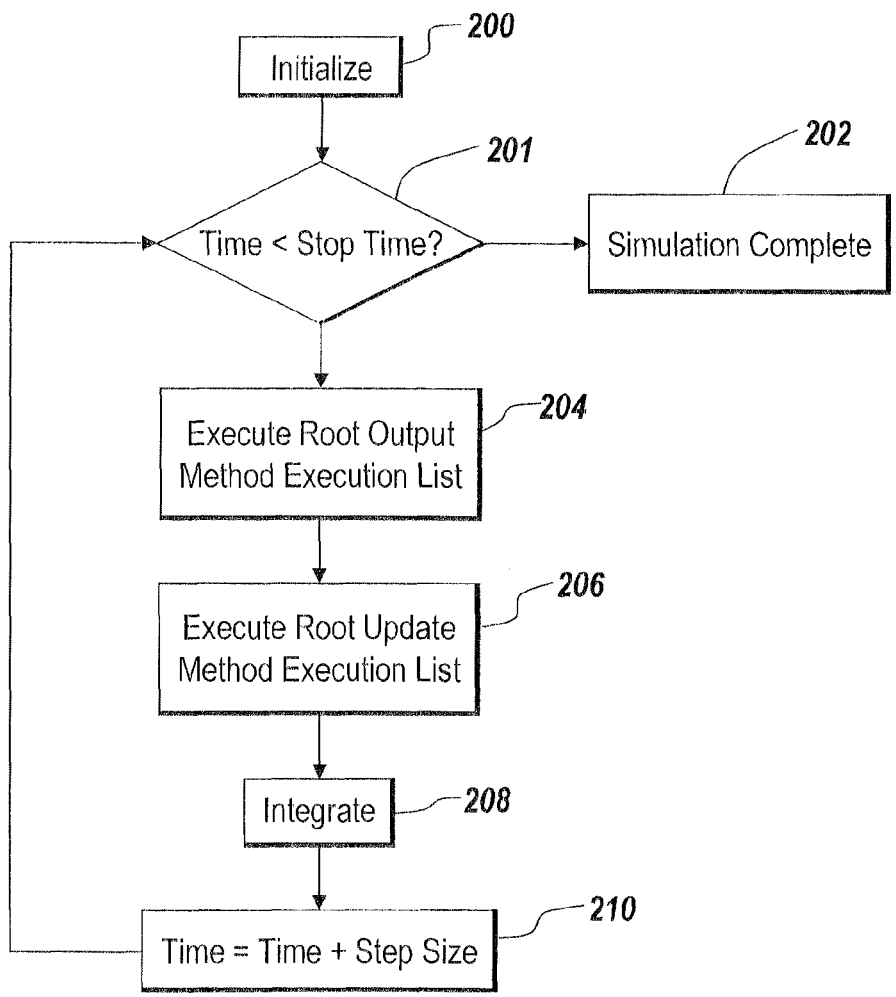
FIG. 10 is a flowchart of the sequence of steps followed by a single-tasking execution loop.

In a single-tasking SimLoop, there is essentially a single execution time-line. On this time-line, each block is executed when it has a sample hit. A sample hit is defined to an execution time instant that is an integer multiple of the block's sample time. To aid in execution, execution lists are constructed for each method type. FIG. 10 depicts the sequence of steps followed by a single-tasking execution loop. Following initialization (step 200), a time parameter is checked to see if the current time is less than the stop time (step 201). If the time is not less than the stop time, the simulation ends (step 202). If the time is less than the stop time, the simulation continues and the root output method execution list is executed (step 204). Following execution of the output method list (step 204) the update method execution list is executed (step 206). Following the performance of an integrate step (208)(the Integrate step is described more below in FIG. 14), the time parameter is incremented by the applicable step size (step 210).

Figure 11A:
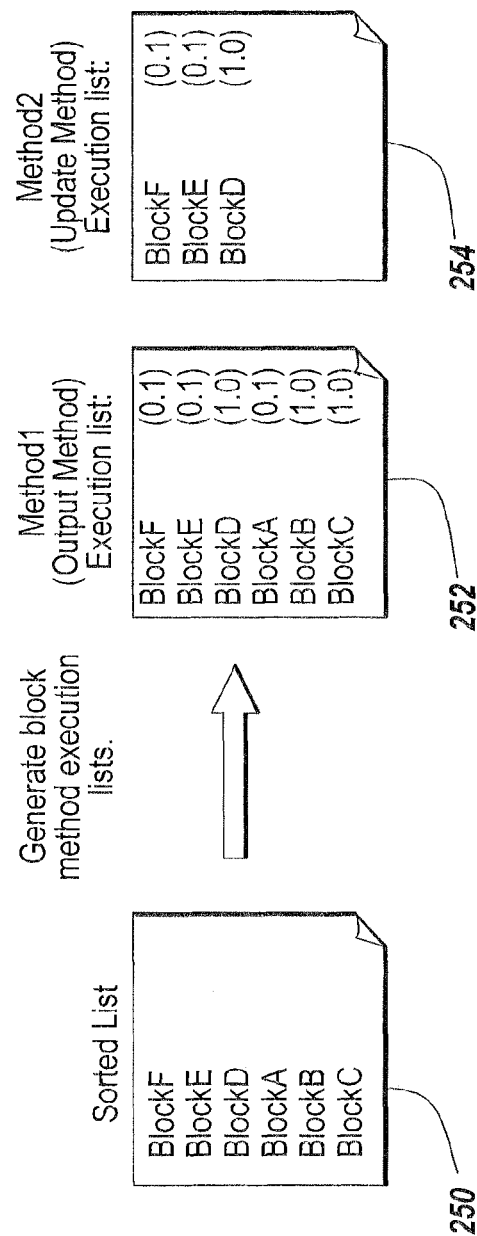
FIG. 11A depicts the creation of execution lists from sorted lists in single task mode.

Blocks are arranged in the single-tasking execution lists in the sorted order as shown in FIG. 11A. A sorted list 250 is used to generate an Output method execution list 252 and an Update method execution list 254. Referring back to the example in FIGS. 7 and 8, the engine sequentially steps through and execute each block in the block method execution list when the execution time divided by the sample time equals an integer number (1, 2, 3, 4, etc.). At time zero ($T_0$), all the blocks are executed. This involves executing the Output methods for blocks F, E, D, A, B, and C (in this order as dictated by the sorted list) and then executing the Update methods of blocks F, E, and D (again, in this order based on the sorted list). The execution time then is then incremented by step size, which in this case is assumed to be 0.1 seconds. Execution then commences once again at the top of the loop for T=0.1 ($T_{0.1}$). Blocks F and E have a sample time of 0.1 seconds and have a sample hit (0.1÷0.1=1, sample time is an integer multiple of the execution time), so the output block methods for Blocks F and E are executed. Block D, however, has a 1.0 second sample time and has no sample hit (0.1÷1.0=0.1, sample time is not an integer multiple of the execution time), so its output block method is not executed (essentially it is skipped). Block A, like Blocks F and E, has a 0.1 second sample time and so its output block method is executed. Blocks B and C, like Block D, have 1.0 second sample times and are skipped during this iteration of the simulation loop, which completes execution of the output block method execution list for $T_{0.1}$.

Figure 11B:
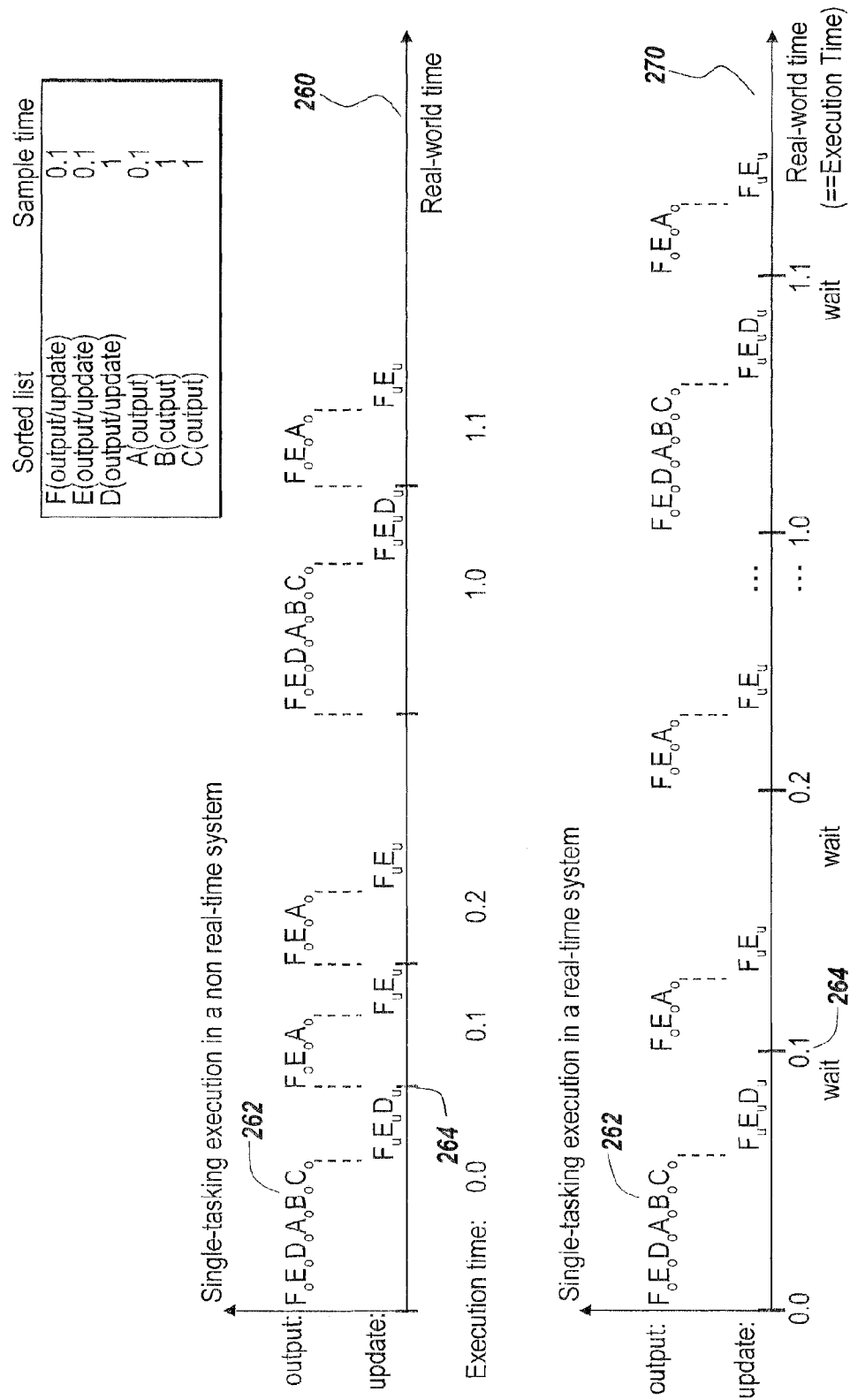
FIG. 11B depicts the execution timing of block diagrams in single task mode in timelines synchronized and non-synchronized with real world time.

The execution timing of the example block diagram in single task mode is shown in the first time-line of FIG. 11B. In this diagram, note that the execution-time is not synchronized with real-world time. Instead, execution time progresses as fast as it can in real-world time. The sorted list 259 is executed on the time-line 260. The methods in the list 262 are executed at the appropriate time step 264. Block diagram modeling software can also allow users to simulate real-world conditions by synchronizing execution time with real-world time. Such execution is illustrated in the second timing diagram of FIG. 11B. The methods 262 are implemented at a time-step 264 synchronized with real world time on the time line 270.

Figure 12A:
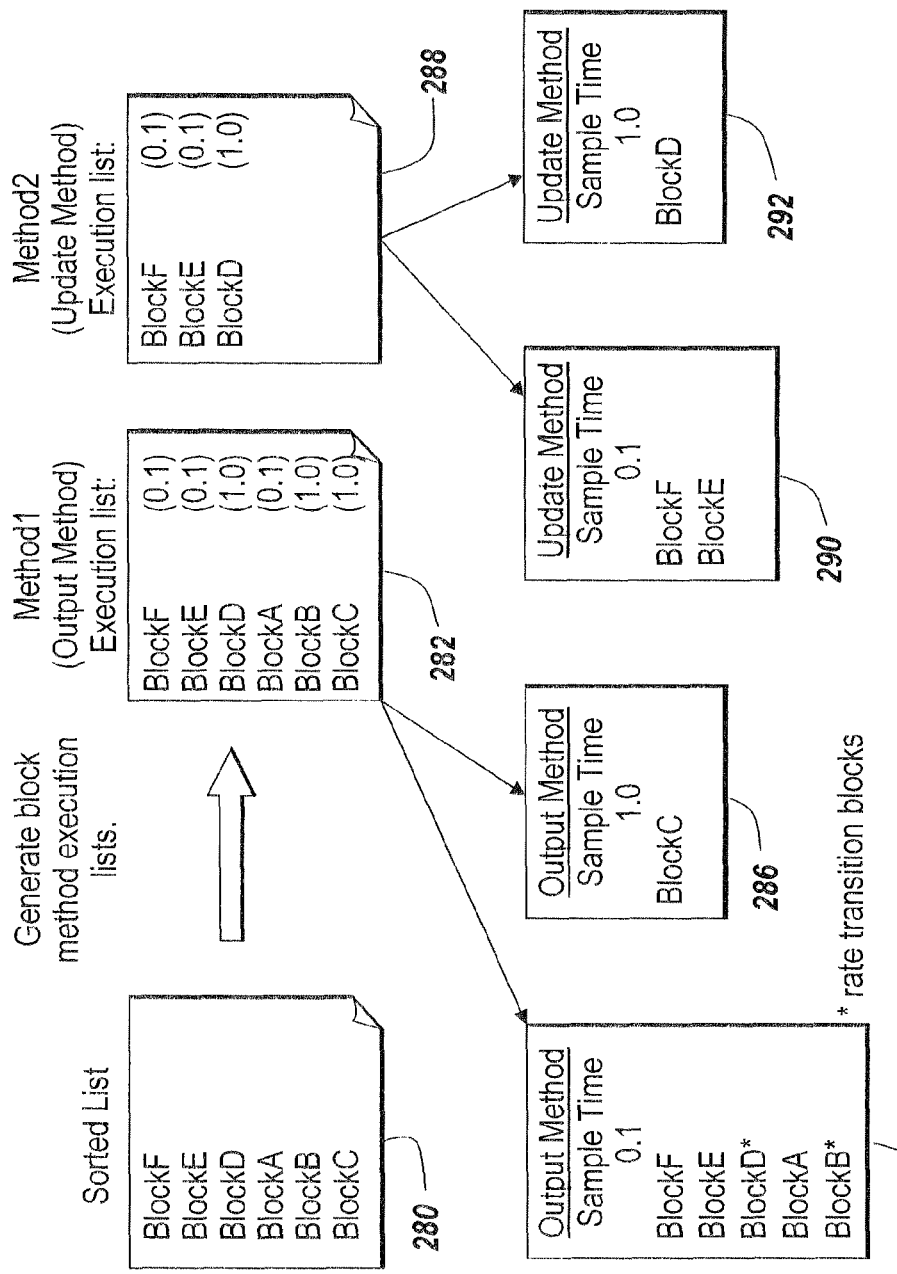
FIG. 12A depicts the creation of execution lists from sorted lists in multi-task mode.
Figure 13:
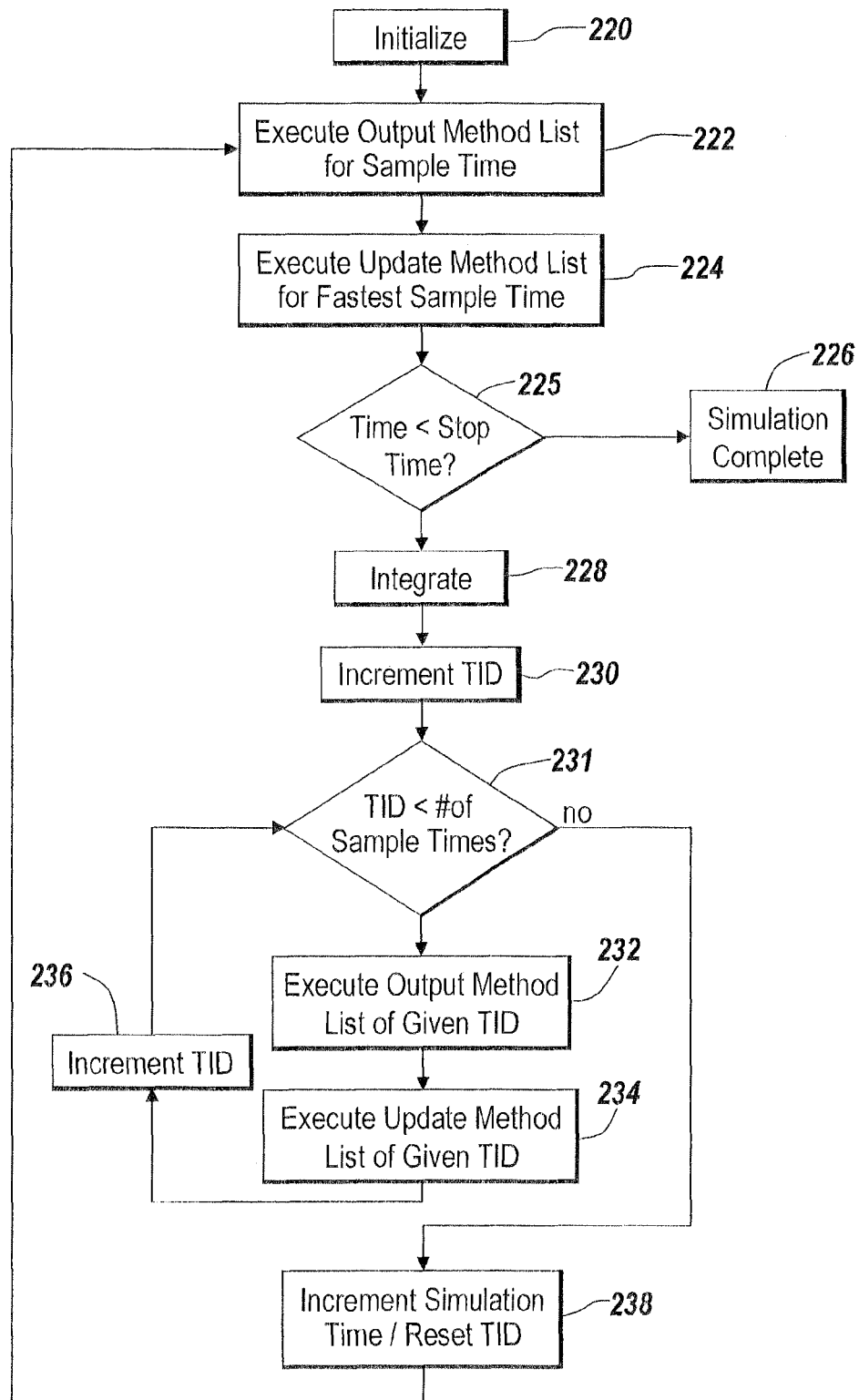
FIG. 13 is a flowchart of the overall sequence of steps taken by Simulink in multi-task mode.

In multitask mode, the engine performs execution along multiple time-lines based upon the number of block sample times used in the mode as shown in the flowchart of FIG. 13. In the example of FIGS. 6 and 7, the model's blocks have a sample time of either 0.1 seconds or 1.0 second. This implies that the engine runs one set of blocks along a 0.1 second time line and another set of blocks along a 1.0 second time line. In order to run in multitask mode, the execution lists are first divided on the basis of methods (as in single-tasking mode) and then subdivided again based upon block sample times. This is illustrated in FIG. 12A. The sorted list 280 is used to generate an output method execution list 282 and update method execution list 288. The output method execution list 282 is split into two separate list execution lists 284 and 286 based on sample times. Similarly, the update method execution list 288 is divided into two update method execution lists 290 and 292 based on sample times.

The execution engine uses the divided execution lists to create multiple execution time lines. In the multitask mode the engine places a higher execution priority on the faster sample time blocks than the slower sample time blocks. This prioritization is carried out by assigning Task Identification Numbers (TIDs) to each execution list; the higher the priority, the lower the TID. For example, a TID of 0 executes at a higher priority than a TID of 1, and so forth. Furthermore, because, during execution in multitask mode, execution transitions between the faster and slower blocks, and vice-versa, the multitask mode requires rate transition blocks that allow the model to transition from blocks running at fast sample times, in our example 0.1 seconds, to slower samples times, e.g., 1.0 seconds. The rate transition blocks are required to correctly simulate how a multi-rate system would behave in a real-time environment. To provide this transition, the engine promotes rate transition blocks to the TID of the fast block for which transition is being provided, although the engine executes these rate transition blocks at their slower rate. This is why Blocks D and B appear in the 0.1 sample time output method execution list in FIG. 12A.

Figure 12B:
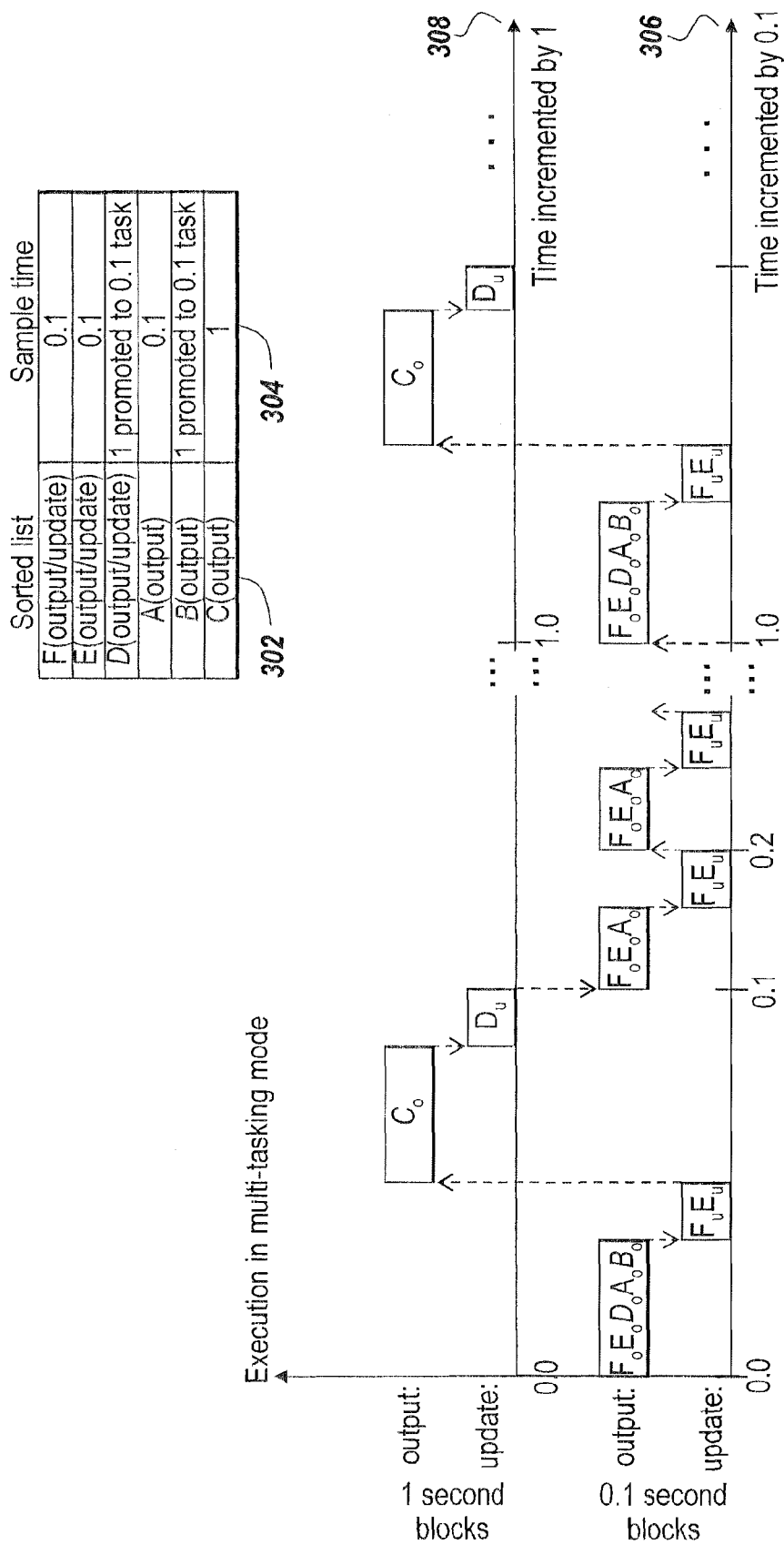
FIG. 12B depicts the execution timing of block diagrams in multi-task mode.

The execution of our example in the multi-task mode may be seen in FIG. 12B. At time T=0, the engine first executes the high priority output methods (those with TID 0) for Blocks F, E, D, A and B, then it executes the high priority update methods (those with TID 0) for Blocks F and E. After finishing the high priority blocks, the engine executes the lower priority output block methods (those with TID 1) for Block C, and then executes the lower priority update methods (those with TID 1), which, in this example, is Block D. In contrast to the single task mode, in multitask mode the engine runs through a TID inner loop to execute the output and update block methods before going on to the Integration step, as the flow chart in FIG. 13 which is discussed below illustrates.

As a result of the inner TID loop, as well as the segregated block method execution lists, the order of execution in multitask mode differs from the order of execution in single task mode. Recall for the example that in single task mode that the order of execution at T=0 is: $F_o, E_o, D_o, A_o, B_o, C_o, F_u, E_u$, and $D_u$, where the subscript "o" stands for output method and the subscript "u" stands for update method. In the multitask mode, however, the order of execution at T=0 is: $F_o, E_o, D_o, A_o, B_o, F_u, E_u, C_o$, and $D_u$. Notice that $C_o$ is executed in a different order in multitasking mode. This occurs because separate method execution lists (based upon sample time) are created and run in order from fasted sample time to slowest sample time. Additionally, the use of rate transition blocks restricts the connection of blocks with different rates. By requiring the insertion of these blocks into the model, the engine ensures that execution in multitask mode will follow the sorted list.

After it is finished executing the block methods for T=0, like in the single task mode, the execution time is incremented (again assume by 0.1 seconds) and execution goes to the beginning of the loop. The engine executes $F_o, E_o, A_o, F_u$, and $E_u$, and the engine does not execute the block methods of Blocks D, B, and C because the current execution time is not an integer multiple of those block's sample time. The engine repeats this execution until the execution time is incremented to 1.0 seconds, whereupon execution occurs in the same manner as described for T=0. The engine repeats this overall process until the execution stop time is reached.

FIG. 12B shows two time-lines; the lower time-line 306 represents the execution order of the faster sample time blocks (Blocks A, E, and F), along with the rate transition blocks (Blocks B and D), while the top time-line 308 shows the execution order of the slower sample time block (Block C), and the rate transition (Block D) update method. The time-lines are generated from the sorted list 302 and the associated sample times 304. The lower line, representing the faster sample times has a TID of 0, and the top line has a TID of 1. For execution time T=0, the chart shows that the engine executes the output methods for Blocks F, E, D, A, and B (designated on the chart as $F_o, E_o, D_o, A_o, B_o$). Then, consistent with the flow chart for the multi-tasking mode (see FIG. 13 discussed below), the engine executes the update block methods for Blocks F and E (designated $F_u$, and $E_u$). Once the engine is finished with the high priority block methods, the output method for Block C ($C_o$) and the update method for rate transition block D ($D_o$) are executed. The execution time is then incremented by the step size (continue to assume 0.1 seconds) and the blocks that have a sample hit are executed. The figure shows execution of $F_o, E_o, A_o, F_u$, and $E_u$, which is repeated, as noted above, until execution time equals 1.0 second. Notice, like in the non-real-time case for Single-task mode, the engine does not wait for time to elapse; rather it executes block methods immediately upon completion of the previous pass through the loop.

FIG. 13 shows the overall sequence of steps taken by Simulink in multitask mode. Following initialization (step 220), the output method execution list is executed for the fastest sample time (step 222). The update method execution list is then executed for the fastest sample time (step 224). A time time parameter is checked (step 225) to determine to determine if the time is less than a designated stop time. If the stop time has been reached, the simulation completes (step 226). Otherwise, the integrate stage (step 228) is performed. The task ID variable is incremented (step 230) and compared to a parameter of the number of sample times (step 231). If the task ID is less than the number of sample times, the output method execution list for the methods assigned the new task Id are executed (232) followed by the execution of the update method execution list assigned the new task ID (step 234). The task ID variable is incremented and the process iterates with the task ID being compared to the number of sample rate times (step 231). When the task ID number is determined to equal the number of sample rate times, the simulation time is incremented (step 238) and the entire process iterates with the output method list execution list (step 222) being executed for the fastest sample times. The process continues until the end of simulation when the time equals the stop time (step 226).

In order to understand how the step size is picked within SimLoop, it is first necessary to understand the notion of a solver. The solver is a module of the execution engine that is responsible for performing two tasks: (a) determining how far execution time should be advanced between consecutive passes through the SimLoop in order to accurately trace the system's outputs, and (b) integrating the derivative of the states of the system to obtain the actual states. Based on how solvers perform the first task, they are generally classified into two basic classes: Fixed-step solvers or Variable-step solvers.

Fixed-step solvers are solvers in which the time step-size between consecutive passes through the SimLoop is a fixed quantity. The user generally explicitly specifies this quantity. These solvers are used to model types of systems that must operate within a defined time (discrete systems). For instance, an anti-lock braking system may be designed to control a car's braking system, and to execute such control in one-one hundredth (0.01) of a second so as to assure the car stops safely; if the braking system does not meet its timing constraints, the car may crash. Fixed-step solvers, therefore, are designed to help model discrete systems that have to generate a result in a fixed time period, and the fixed-step execution assures that the modeled system can generate such results.

Variable-step solvers are designed to model continuous systems where non-evenly spaced time steps are needed to simulate all significant behavior. For example, one may want to simulate the path of a bouncing ball, where it bounces, how high it bounces, and where it stops. It is known, based on experience, that the ball's bounces will not be evenly spaced, and that the height of the bounces will diminish as a result of gravity, friction, and other forces. Variable-step solvers are used for these types of continuous systems and to determine what step size to use so that the behavior of the ball will be accurately modeled.

The two broad classes of solvers are further subdivided based on the integration task they perform. There are several algorithms for carrying out numerical integration. The particular choice of the integration algorithm gives rise to the subclasses of solvers.

Figure 14:
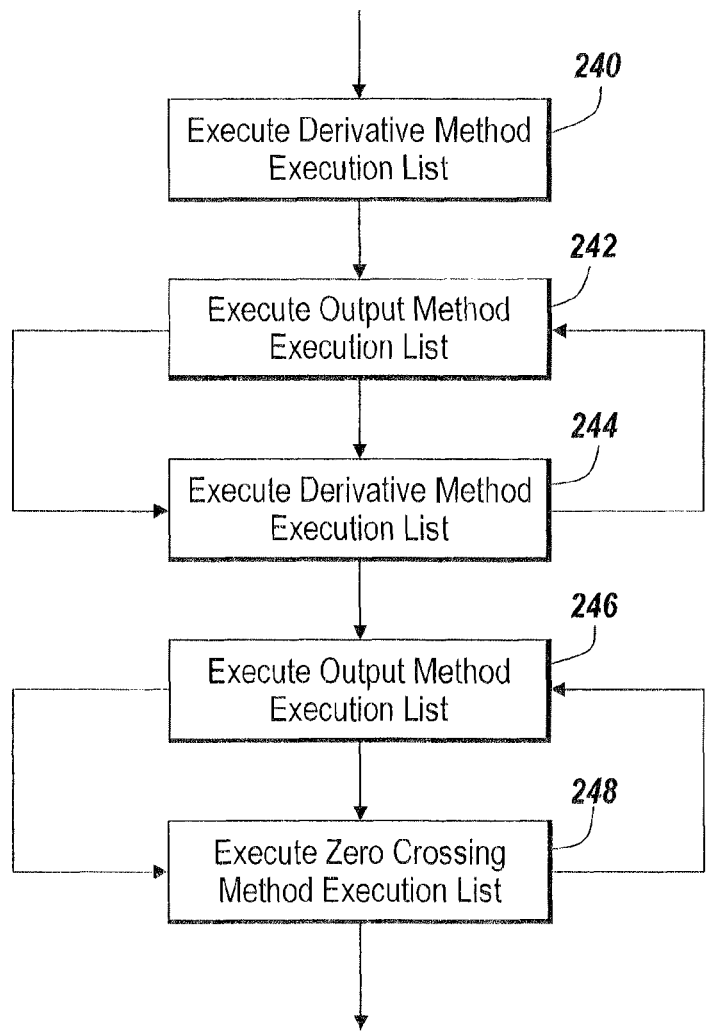
FIG. 14 is a flowchart of the sequence of steps followed by a variable-step solver.

The difference in the conceptual definition of Fixed- and Variable-step solvers leads to the functional difference in the context of the SimLoop. The major difference between the solvers arises in the Integrate step of the SimLoop which is depicted in FIG. 14. During the Integrate step, the Variable-step solver executes the Output and Derivative block method lists for a number of iterations that varies based on the solver subclass (i.e., the numerical integration algorithm it uses) and integration error tolerances. In a fixed-step solver, the number of iterations is fixed for a given solver subclass. Another difference between solvers arises in the Integrate phase in the context of an operation known as zero-crossing detection. Zero-crossings in the derivatives of the state generally indicate a discontinuity in the states themselves. Because discontinuities often indicate a significant change in a dynamic system, it is important to trace the system outputs precisely at such points. Otherwise, the outputs of the model could lead to false conclusions about the behavior of the system under investigation. Consider, again the example of the bouncing ball. If the point at which the ball hits the floor occurs between simulation steps, the simulated ball appears to reverse position in midair. This might lead an investigator to false conclusions about the physics of the bouncing ball. To avoid such misleading conclusions, it is important that the execution has time steps on and around the vicinity of discontinuities.

In the case of Fixed-step solvers, there is no notion of zero-crossing detection and one is not guaranteed to find all points of discontinuity. One can only keep reducing the step-size to increase the probability of hitting the discontinuity. Contrastingly, in the case of Variable-step solvers, the Integrate step explicitly includes zero-crossing detection. The execution step size is then adjusted accordingly to ensure that discontinuities are tracked accurately. To enable zero-crossing detection, blocks that can produce discontinuities instantiate a special execution method. This method registers a set of zero-crossing variables with the execution engine, each of which is a function of a state variable that can have a discontinuity. The zero-crossing function passes through zero from a positive or negative value when the corresponding discontinuity occurs. During the zero-crossing detection phase of the Integration step, the engine asks each block that has registered zero-crossing variables to update the variables for the projected time of the next time step. These variables are then checked for a change of sign since the current step. Such a change indicates the presence of a discontinuity. An iterative process then tries to narrow down the location of the discontinuity and ensure that the next few time steps (at least 2) accurately bracket the location of the discontinuity. The final difference, which is in the step-size during execution, is a direct consequence of the two previous differences in the step-size determination. In Fixed-step solvers, the step size is a known and fixed quantity. For Variable-step solvers, the step size is determined during the integration iterations and the zero-crossing detection that happens during the Integration step.

An example of the variable-step solver is shown in FIG. 14, the derivative method execution list is executed (step 240) followed by the output method execution list (step 242). The derivative method execution list is then executed again (step 244) and the solver iterates between the execution of the output method execution list (step 242) and the execution of the derivative method execution list (step 244). A similar iteration loop then occurs between the execution of the output method execution list (step 246) and the execution of the zero-crossing method execution list (step 248). Note that Simulink also includes other methods such as Projections and Jacobians in this step as needed.

While it is theoretically possible to have Variable-step solvers in the context of multitasking, such a combination is not employed in practice. This is because the step-size for such solvers can become very small making it impossible to keep up with the real-time constraint that generally goes along with multitasking execution. An added complication is that the integration step in such solvers is iterative and takes varying amounts of time at each step of the execution. Therefore, Variable-step solvers are generally used only in conjunction with the Single-Tasking SimLoop. Additionally, they are not usually employed in systems that need to operate in real-time.

When a model contains an algebraic loop, the engine calls a loop solving routine at each time step. The loop solver performs iterations and perturbations to determine the solution to the algebraic condition (if it can). One possible approach to solving the algebraic equation $F(z)=0$, is to use Newton's method with weak line search and rank-one updates to a Jacobian matrix of partial derivatives. Although the method is robust, it is possible to create loops for which the loop solver will not converge without a good initial guess for the algebraic states z. Special blocks are generally provided to specify an initial guess of the states in the algebraic loop.

In addition to the various forms of the SimLoop, modeling packages such as Simulink use the output of the Link stage to compute linear models through a process generally referred to as model linearization. These linear models may be used in the SimLoop at various points in the execution of the overall model. Alternatively, the linear model may be returned to the user. The linearization process involves the use of a Jacobian method defined on blocks and numerical Jacobian algorithm.

Information related to the compiled block diagram may be presented to users in an automatically generated report. This report allows users to quickly obtain documentation of the functional description of their model. Information related to the execution of a particular model (such at the time taken to execute various portions of the model and the coverage of various portions of the model) may be obtained automatically and presented to the user as a report.

Figure 15:
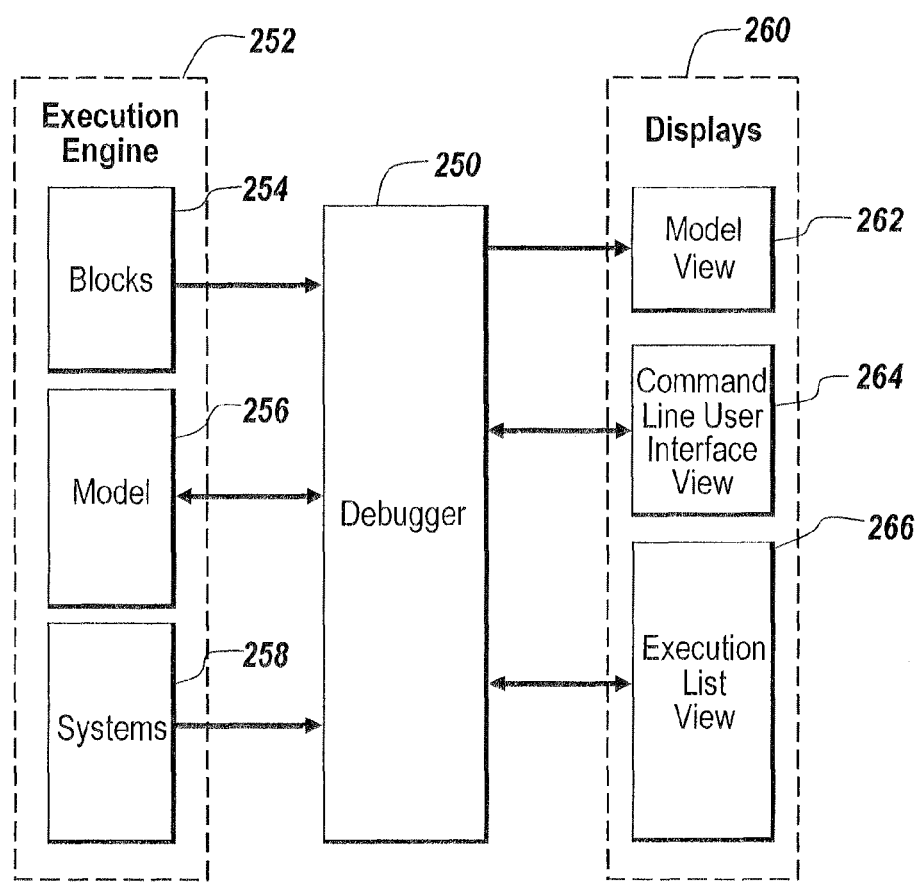
FIG. 15 depicts a block diagram of the debugger architecture and main data structures for interpreted simulation mode in an illustrative embodiment of the present invention.

FIG. 15 illustrates the flow of information between the components that make up the debugger 250 of the present invention and the components of the execution engine 252 that interact with the debugger. There are three types of functional units in the compiled block diagram that interact with the debugger 250. The model unit 256 is the main data structure that contains the compiled information of the block diagram. A model has methods such as outputs, update and/or derivatives. The systems units 258 are collections of blocks that are contained inside non-virtual subsystem blocks. The exception is the root system, which contains all blocks in a block diagram but has no corresponding subsystem block. A system also has methods such as outputs, update and/or derivatives. The block units 254 also represent a collection of methods such as outputs, update and/or derivatives.

Information is sent to the debugger 250 from the block units 254, system units 258 and the model unit 256. The debugger 250 sends information to the model 256 to control execution.

The debugger 250 interfaces with a display 260 that uses three views to display information to a user. The information is displayed via a model view 262, a command line interface view 264, and an execution list view 266. The model view 262 is the graphical representation of the block diagram. The debugger 250 modifies the model view 262 as necessary. The command line user interface view 264 enables the user to interact with the debugger by typing the debugger commands at a prompt. The user may also interact with the debugger 250 through graphical elements such as buttons, checkboxes and radio buttons. The debugger 250 also has an execution list view 266. The execution list view 266 shows the current list of executing methods for the model simulation. Information is sent from the user interfaces to the debugger 250 and the debugger updates the views 262, 264 and 266 as needed.

Figure 16A:
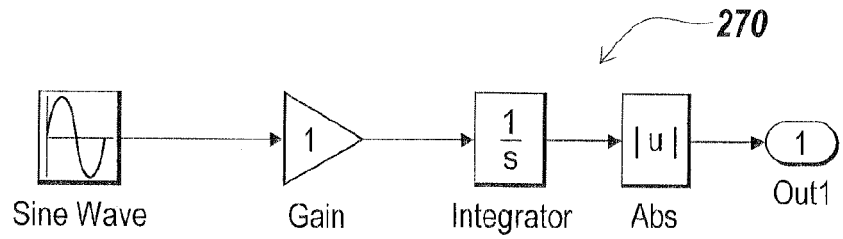
FIG. 16A depicts a sample block diagram.
Figure 16B:
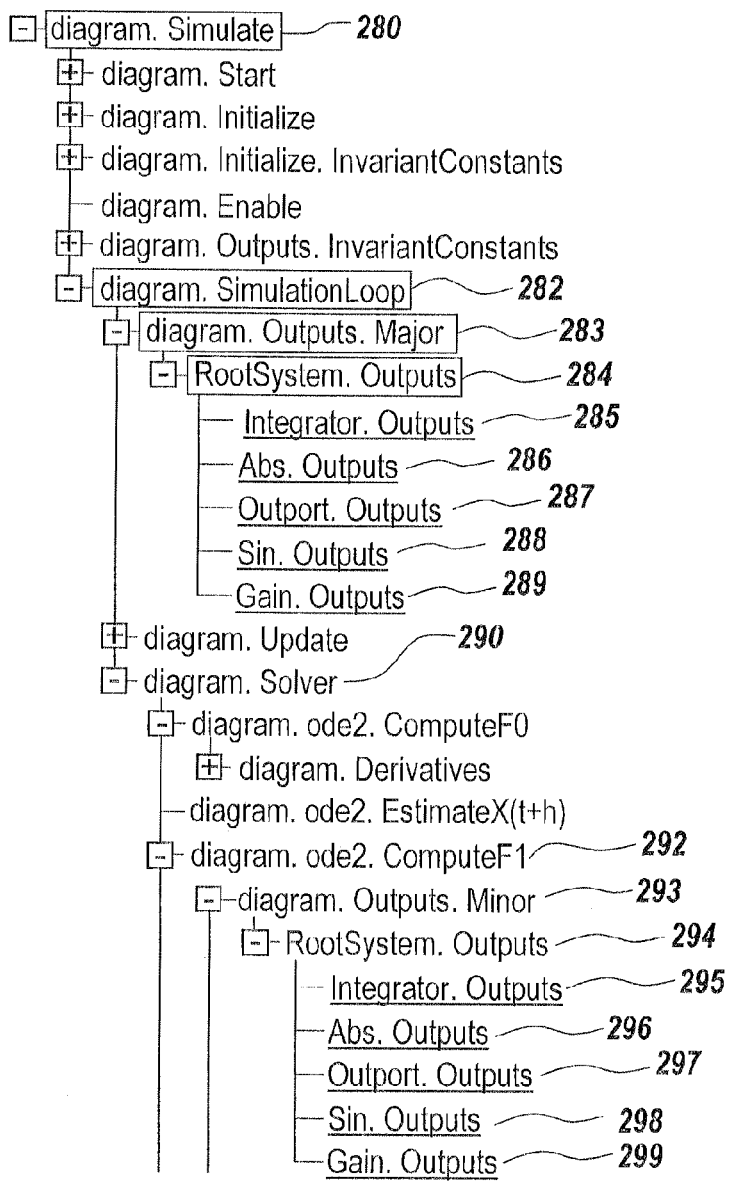
FIG. 16B depicts an execution list for the methods of FIG. 16A.

The execution engine invokes methods for blocks, systems or the model as needed. FIG. 16A shows a block diagram 270 named "diagram". FIG. 16B shows an execution list for some of the methods of the block diagram that have executed for the model depicted in FIG. 16A. The methods may be nested. In FIG. 16B, the output method of the Integrator block (Integrator.Outputs) 288 is called inside the RootSystem output method (RootSystem.Outputs) 286. The indentation from the left is to show which method executes nested inside which other method. The execution engine may call a method multiple times in different contexts (as part of different chains of methods). In FIG. 16B, the outputs method of the RootSystem is called in two places 286 and 296, once inside the model's major output method (diagram.Outputs.Major) 284, and once inside the model's minor output method (diagram.Outputs.Minor) 294.

For debugging purposes, 'unique method invocations' are important. A unique method invocation is the execution of a method that belongs to a particular block, system or model instance in a specific execution list of called methods. In FIG. 16B two unique method invocations of the outputs method of the RootSystem (RootSystem.Outputs) are shown. The two unique execution lists are as follows with the method to the left of the '>' symbol calling the method to the right of the '>' symbol:
1. diagram.Simulate 280>diagram.SimulationLoop 282>diagram.Outputs.Major 284>RootSystem.Outputs 286
2. diagram.Simulate 280>diagram.SimulationLoop 282>diagram.Solver 290>diagram.ode2.ComputeF1 292>diagram.Outputs.Minor 294>RootSystem.Outputs 296

The debugger of the present invention monitors the unique method invocations by creating a record for each unique method invocation. This record contains:
1. The record identifier (record id). This is a numeric value that is unique to each record.
2. An identifier of the current method (the method id)
3. An identifier of the block, model or system that the method belongs to (owner id). The owner of a method is an entity, a block or a system of the model that calls the method. The owner id enables the debugger to have access to additional properties of the owner.
4. In some cases, another piece of information to distinguish methods that have the same owner id and method id (attribute).
5. Access to records of the methods that were executed inside this method (child records).
6. Access to the record in which the method of this record is executed (parent records).
7. The state of the method invocation. The state can be one of the following: entering, entered, exiting, exited (state). The state information enables a user of the modeling and execution environment to determine the exact point in execution of a method and compare it to other generated debug data. This is a major benefit in problem analysis.

Optional information can be stored in this record such as specific debugger actions to be taken if this record is processed or whether to break at this invocation. Profiling information such as how many times a unique method invocation was executed can also be stored.

For example, in FIG. 16B, the record for the first unique method invocation for RootSystem.Outputs 286 is:
id: 5
method id: Outputs
owner id: RootSystem
attribute: 0 (there is no ambiguity that needs to be resolved)
child records contain access to:
Record for Integrator.Outputs 288
Record for Abs.Outputs 296
Record for Outport.Outputs 297
Record for Sin.Outputs 298
Record for Gain.Outputs 299
parent record contains access to:
Record for diagram.Outputs.Major 283

The record for the second one is:
id 17
method id: Outputs
owner id: RootSystem
attribute: 0 (there is no ambiguity that needs to be resolved)
child records contain access to:
Record for Integrator.Outputs 285
Record for Abs.Outputs 286
Record for Outport.Outputs 287
Record for Sin.Outputs 288
Record for Gain.Outputs 289
parent record contains access to:
Record for diagram.Outputs.Minor 293

The debugger creates a root record when simulation begins. All other records are added as child records of the root record. The debugger also monitors the current record. The current record is the record of the current or most recently executed unique method invocation.

Figure 17:
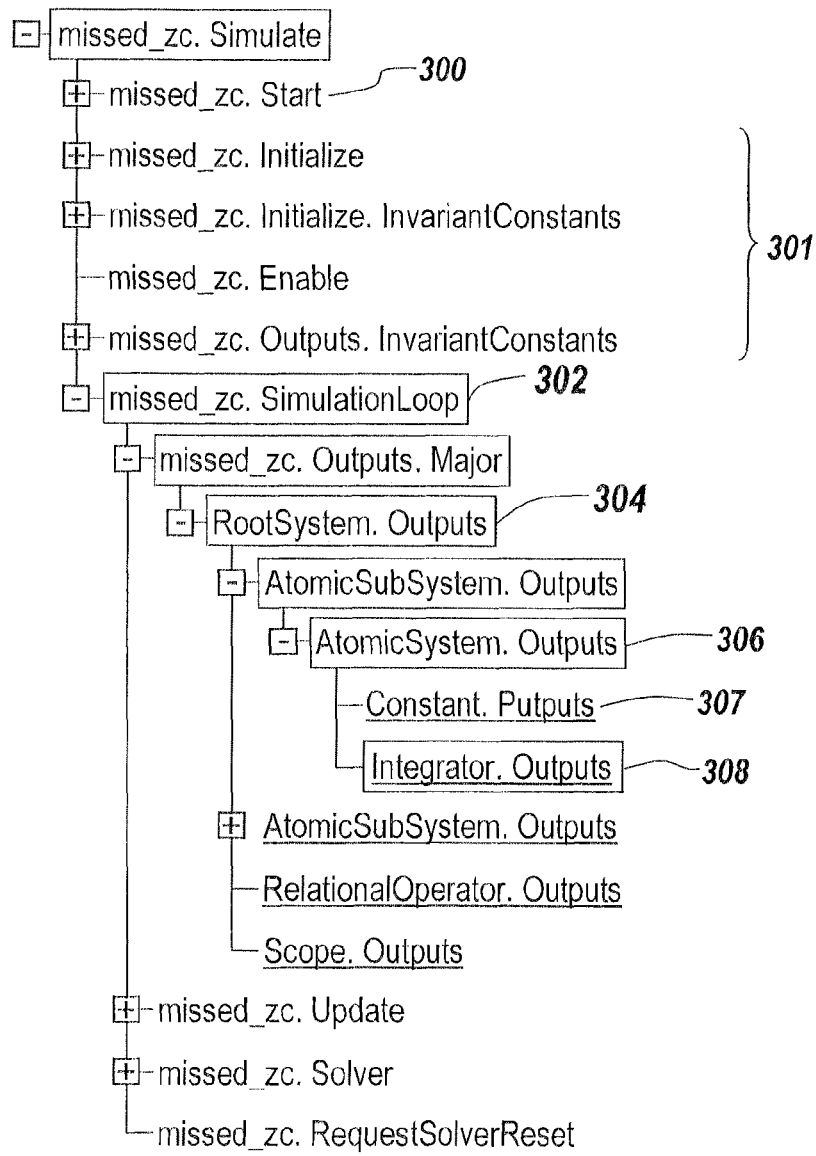
FIG. 17 depicts dependent methods in the execution list.

During model simulation, a number of methods are invoked on the model parts to generate dynamic behavior. At any point during the simulation, the illustrative embodiment of the present invention generates an execution list view that allows the methods that have executed so far within a major time step to be displayed in a tree format. The execution list view may be shown in a separate window with the model view on a display being viewed by the graphical environment user. Alternatively, the execution list view may be shown in place of the model view or in some other arrangement on a display. In FIG. 17 part of the execution list of methods for a model is shown. When simulation starts, first the Start methods of all blocks that have registered this method are executed 300. A number of other initialization and preliminary methods 301 are called before the main simulation loop, SimulationLoop 302, is entered. The execution list in FIG. 17 is displayed at the point in simulation where the output of a major time step is being computed. In this case, the output of the RootSystem block 304 calls the output of the generator atomic subsystem 306 that has a constant 307 and integrator 308 block inside. The output call is re-directed to invoke the output of the Constant 307 and Integrator 308 blocks inside the generator subsystem. The point in the simulation shown is when the Integrator output 308 is called. Methods in the execution list which are currently executing are highlighted with the last method called shaded more than earlier called methods in the chain. Those skilled in the art will recognize that colors and color intensity or other visual indicators may also be used to indicate the actively executing methods in the execution list. Further, other visual and/or audio effects may be used for such descriptions.

The debugger updates a hierarchical view of the unique method invocations during model simulation. This hierarchical view is the execution list view. The debugger updates the execution list view whenever a new record is created, whenever the current record is changed to another record or whenever a record's state is altered. To draw the execution list view, the debugger starts to process the records beginning from the root record. The root record is created immediately after simulation starts. The method name of the root record is then displayed. If the root record has child records, the method names of the currently existing child records are displayed under the parent record as a list. The names are indented to the right to illustrate the parent record-child record hierarchy. Then the debugger processes the child records of each child record of the root record and displays them as described in the previous paragraph. The children of any record are displayed as a list indented to the right under the name of the method whose children are displayed. If the method of a record is on the active Execution List, that is its state is 'entered' or 'entering', it is colored differently for the user to easily see. These actions are repeated until the all records are processed.

If the method names belong to owners with graphical representations on the model view, the method names are displayed as hyperlinks to the graphical representations. The user can use the mouse to click or double click on the method name and the corresponding graphical owner is marked with special coloring and the window it is contained in is brought forward and given focus. When the user double clicks on a hyperlink, the debugger searches for the graphical representation of the owner of the method, if the owner of the method has a graphical representation, the owner contains methods to access the location and properties of the graphical representation as well. The graphical representation on the model view is altered as explained herein. The reverse is also possible. If the user double clicks on a graphical representation on the model view, the debugger retrieves the owner of the graphical representation and searches the records for records that have the owner as the graphical representation selected by the user. Then the debugger colors the names displayed on the tree view with different colors that belong to the same owner as the graphical representation selected.

The execution list view can be collapsed or expanded to allow the user to see the region the user is interested in. The user can control which records to display. The records can be filtered by owner id, by method id and/or attribute, by owner type or by method type. Only those records that fit a certain search or filter criteria are displayed. In addition, the user can filter by using regular expressions.

Certain unique method invocations are executed only once. Certain unique method invocations are executed less frequently than others. Method invocations are displayed with varying intensity of color to denote the frequency of invocation. Less frequently invoked unique method invocations are drawn with less intensity, more frequently executing invocations are drawn with more intensity.

The execution list view is a tree view that is dynamically updated during model simulation. The debugger updates the execution list view as follows to indicate progress:
1. The name of the current method is colored differently for different states. This is to show whether the method is about to execute or has already executed.
2. The execution list view colors the current method execution list differently as discussed above by processing the records and looking for records with states that are equal to "entered" or "entering".

The execution list view contains graphical elements such as checkboxes to put breakpoints at unique method invocations. When the user checks the checkbox, the debugger sets a breakpoint on the method invocation. The execution list view can contain other information stored in the records such as profiling information.

The execution list view can be superimposed onto the model view. The record displays can be attached to the graphical representations of the owners on the model view.

FIG. 18A illustrates an execution list view 110. The method name is displayed 311 with the method names of the child records indented to the right to show a parent-child hierarchy. The current execution list methods are colored differently 313 with the method names which have graphical representations displayed as hyperlinks 312. Child methods can be seen in an expanded view 314. Also, the record identifier is displayed and a checkbox for a breakpoint is implemented 315.

If the owner of the current record is a graphical entity that is displayed on the model view, the debugger updates the model view to display the current method execution list. The execution list is superimposed on the model view of the block diagram by coloring part of the graphical appearance of blocks that are being executed. In one implementation, both the color and the position of the colored part are related to the executed methods (e.g., Update, Output, Derivatives, and Zero Crossings). The number of times a certain block method has executed per major time step is displayed on the block icon. Each method of a block is represented as a geometric shape on the block icon, such as rectangular patches placed on certain locations of the block icon. Each patch has a color to represent the method it is related to. Those skilled in the art will recognize that other visual indicators may be used in addition to shapes and colors without departing from the scope of the present invention.

Figure 18B:
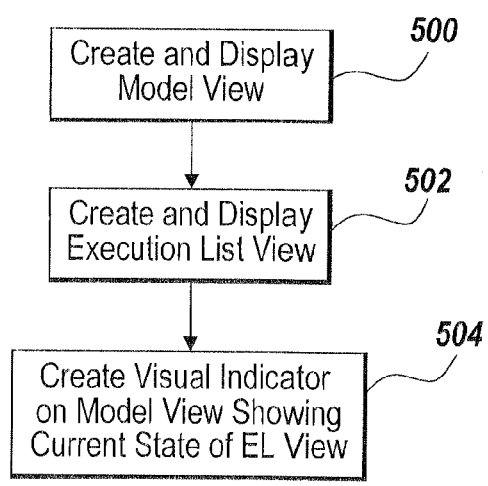
FIG. 18B is a flow chart of the steps followed by the illustrative embodiment of the present invention to visually indicate the state of the execution list view in the model view.

The overall process by which the illustrative embodiment of the present invention visually indicates the current status of the execution list view in the model view is depicted in FIG. 18B. The model view is first created and displayed (step 500). The execution list view is also created and displayed (step 502). The currently executed method(s) of the execution list view are then visually indicated on the model view (step 504).

The superimposing of the current execution list on the model view begins with the debugger calculating the current chain of called methods. The debugger has access to the record of the current unique method invocation, which is the current record. The method of the current record is the most recently called method. The parent record of the current record contains the second method in the execution list; the parent record of the parent record contains the third method in the execution list and so forth until the root record is reached. The root record is not used in drawing the pointer.

Next, the debugger obtains the owners of the current execution list. As the debugger traverses the records from child to parent, it creates a list of owners for each method. The first owner in the list belongs to the last record in the execution list. The last owner in the list belongs to the current record.

The visual display is then drawn on the model view. The first graphical object drawn is the anchor. The shape may contain text such as the currently executing method or any other debugging or block diagram information. The anchor is at a fixed location on the model view such as the left top corner of the model view. The user can change the location if the default location is not suitable. Then, the first arrow is drawn from the fixed anchor to the first element in the owner list that is displayed on the model view.

The owner may be a block, a subsystem block and/or a shape representing the execution engine. If the graphical representation of the owner is not in the same window as the anchor (the graphical representation of the owner is inside a subsystem block), first an arrow is drawn to the interface of the two windows (in this case the subsystem block), then in the destination window, a fixed anchor is drawn as in the main model view window. An arrow is then drawn from this fixed anchor to the graphical representation of the owner. From the first owner's graphical representation, an arrow/arrows is/are drawn similarly to the second owner displayed on the model view. This action is repeated until the last graphically represented owner is reached.

In some cases exit points may be drawn to leave a window.

The arrows may be numbered to help in navigation. The arrows and the anchors may be colored specifically to represent the current method or the method of the owner of the graphical representation to which they are pointing. The arrows can also be drawn in different line styles to convey different information to the user.

Figure 19A:
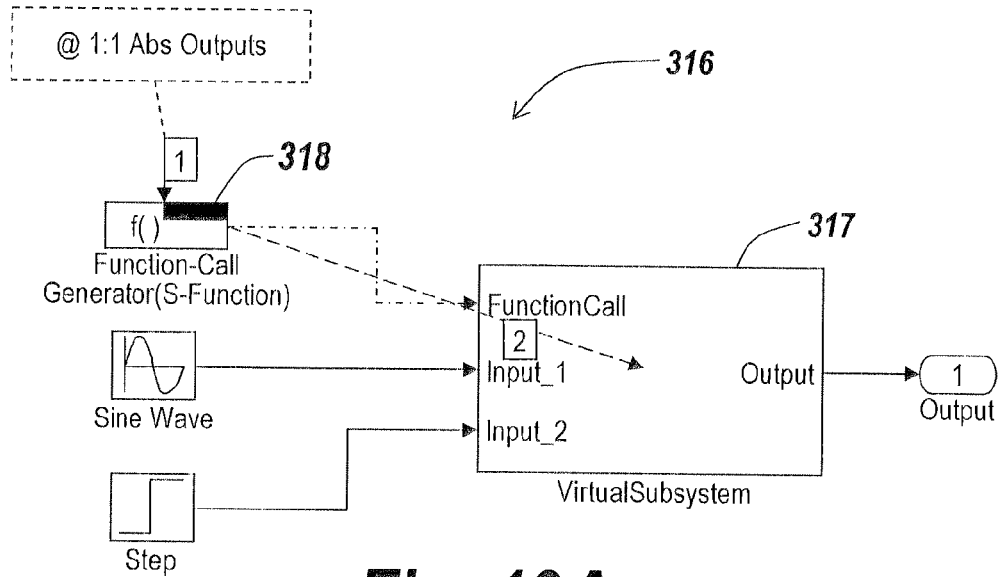
FIG. 19A depicts the Visual Pointer to a virtual subsystem.
Figure 19B:
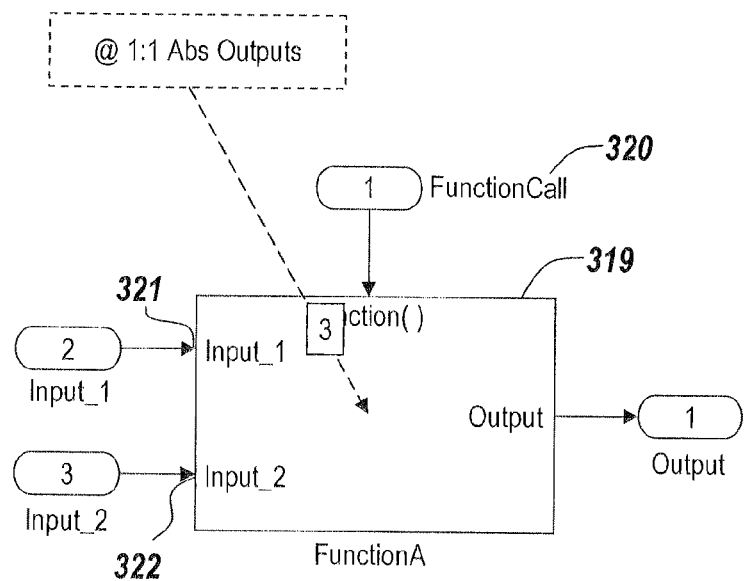
FIG. 19B depicts a non-virtual subsystem inside a virtual subsystem.
Figure 19C:
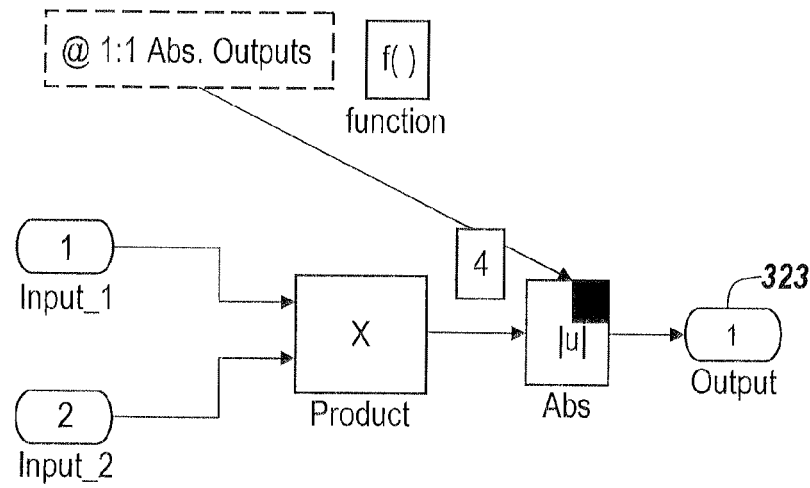
FIG. 19C depicts the contents of a function block.

FIGS. 19A, 19B and 19C show a sample of a visual pointer on block diagram pointer_example_1. The block diagram 316 in FIG. 19A contains a virtual subsystem block VirtualSubsystem 317. This subsystem block is for graphical purposes only and it does not have any methods. The Function-Call Generator 318 is an S-Function block that calls FunctionA 319 in FIG. 19B, a non-virtual function-call subsystem block inside VirtualSubsystem. FunctionA 319 is non-virtual and therefore it contains a system, in this case a function-call system 320. When Function-Call Generator 318 calls FunctionA 319, FunctionA calculates the absolute value of the product of its inputs input_1 (Output of the Sine Wave Block in FIG. 19A) 321 and input_2 (Output of Step Block in FIG. 19A) 322. The contents of FunctionA are shown in FIG. 19C and include an absolute value block 323.

Figure 19D:
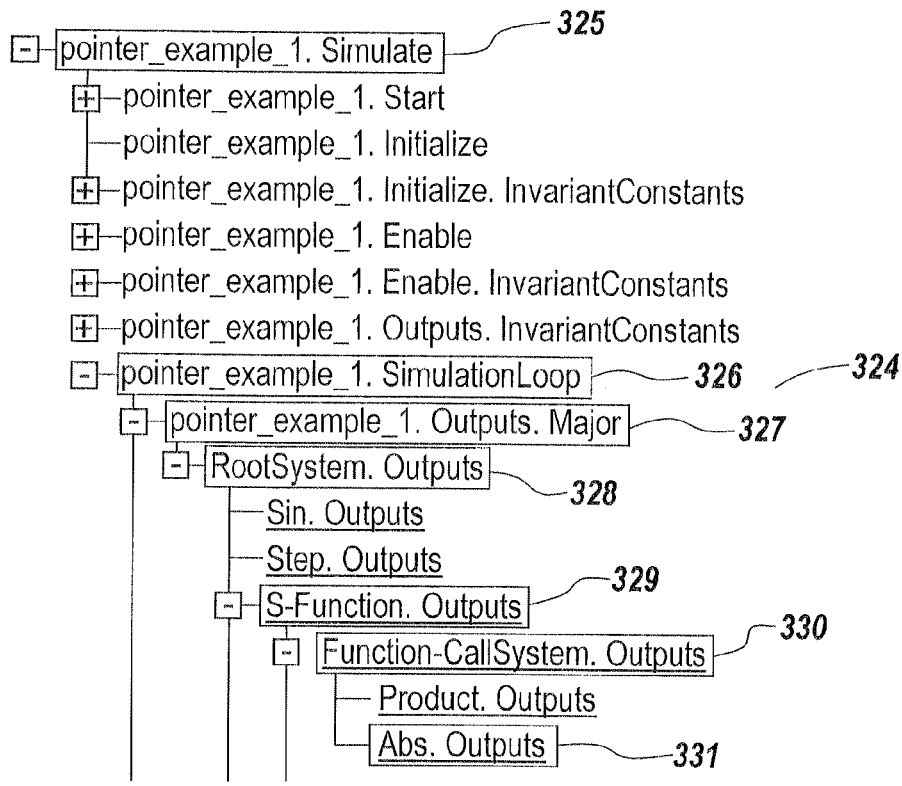
FIG. 19D depicts an execution list for the block diagram of FIG. 19A.

The current method execution list 324 is displayed in FIG. 19D. The execution engine is about to invoke Abs.Outputs method 331. From top to bottom, the current method execution list is:
1. pointer_example_1.Simulate (belongs to the root record) 325;
2. pointer_example_1.SimulationLoop 326;
3. pointer_example_1. Outputs 327;
4. RootSystem.Outputs 328;
5. S-Function.Outputs (Function-Call Generator Block) 329;
6. Function-CallSystem.Outputs 330;
7. Abs.Outputs 331;

FIG. 19A is the top most view of the model pointer_example_1. A rectangular shape is the anchor in the top left corner of FIG. 19A. It contains the name of the currently executing method. The first arrow is drawn from the anchor to the Function-Call Generator block, which is the owner of the S-Function.Outputs method. The first, second, third and fourth methods do not have owners with graphical representation in this implementation. The arrows are numbered for easier navigation. The second arrow is drawn from the Function-Call Generator to the VirtualSubsystem block. The VirtualSubsystem block is virtual and does not have a method in the execution list; however, graphically it contains the graphical representations of the owners of the methods in the execution list so an arrow is drawn pointing at this block. The VirtualSubsystem block owns a window. The contents of that window are shown in FIG. 19B. Since, the pointer crossed to another window, the anchor is redrawn in the new window. The third arrow is drawn from the second anchor to the FunctionA block, which contains the owner of the sixth method (Function-CallSystem.Outputs) on the Execution List. A system does not have a graphical representation of its own; the subsystem block that contains the system is used as its graphical representation. FunctionA is a subsystem and therefore its contents are in a different window FIG. 19C. The anchor is redrawn and an arrow is drawn to the graphical representation of the owner of the last method on the execution list, Abs.Outputs.

Graphical representations for owners without any graphical representations can be drawn as symbols or any other graphical shape. Then the visual pointer can be drawn to traverse these graphical objects.

Figure 20A:
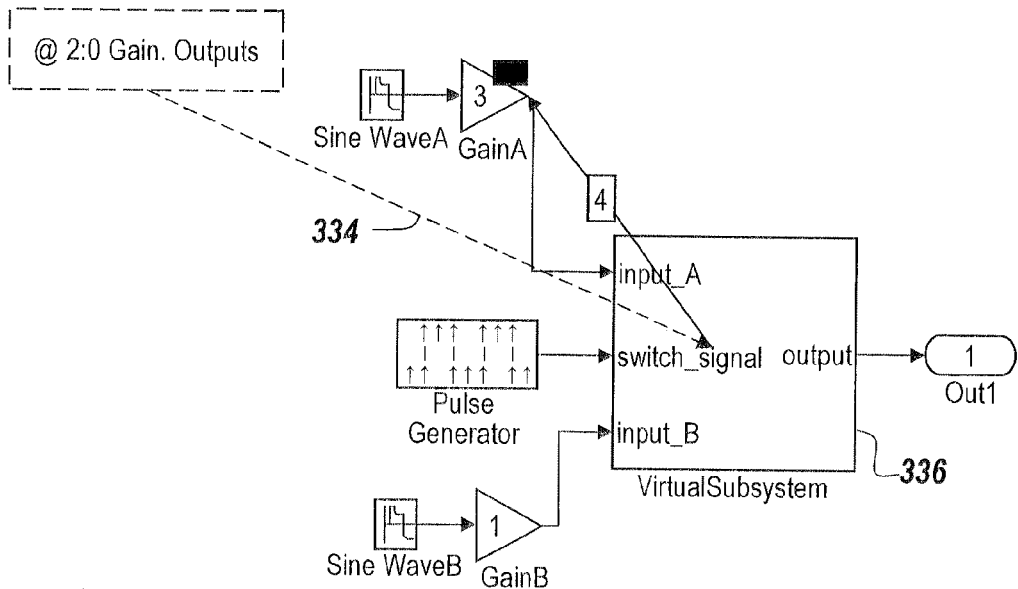
FIG. 20A depicts a block diagram with a visual pointer being drawn into and out of a virtual subsystem.
Figure 20B:
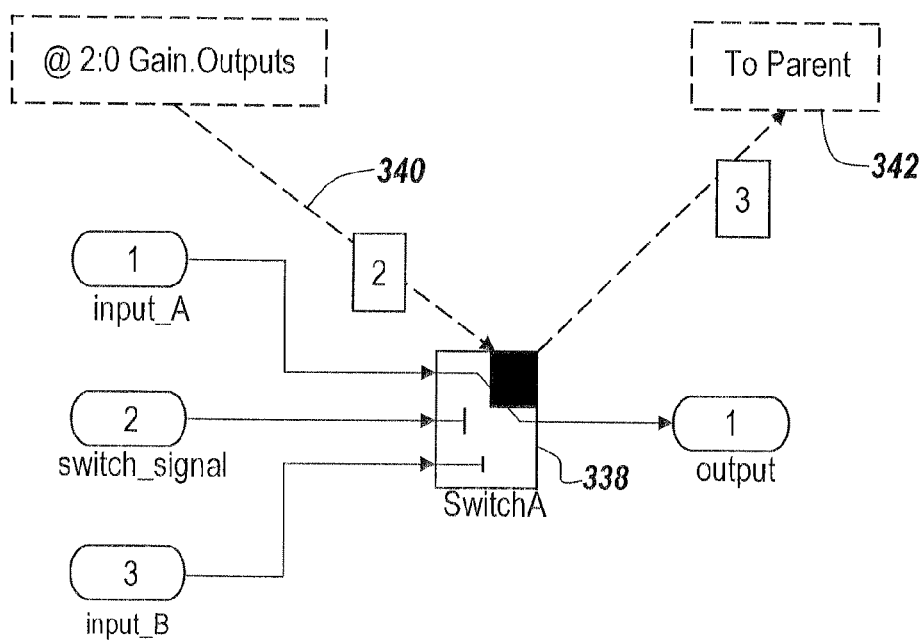
FIG. 20B depicts the visual pointer of 20A entering and leaving the virtual subsystem in greater detail.

In FIG. 20A, the visual pointer 334 enters and leaves the subsystem block VirtualSubsystem 336. The first arrow is drawn to VirtualSubsystem, which contains the SwitchA block 338 shown in FIG. 20B. The second arrow 340 is drawn to the SwitchA block 338. However, the final destination of the pointer is outside VirtualSubsystem. A graphical object 342 is drawn to denote an exit point with the title "To Parent" in FIG. 20B. The pointer continues in FIG. 20A to its final destination. Those skilled in the art will appreciate that other visual cues besides those discussed herein may be used to indicate the chain of method executions and owners without departing from the scope of the present invention.

Figure 21:
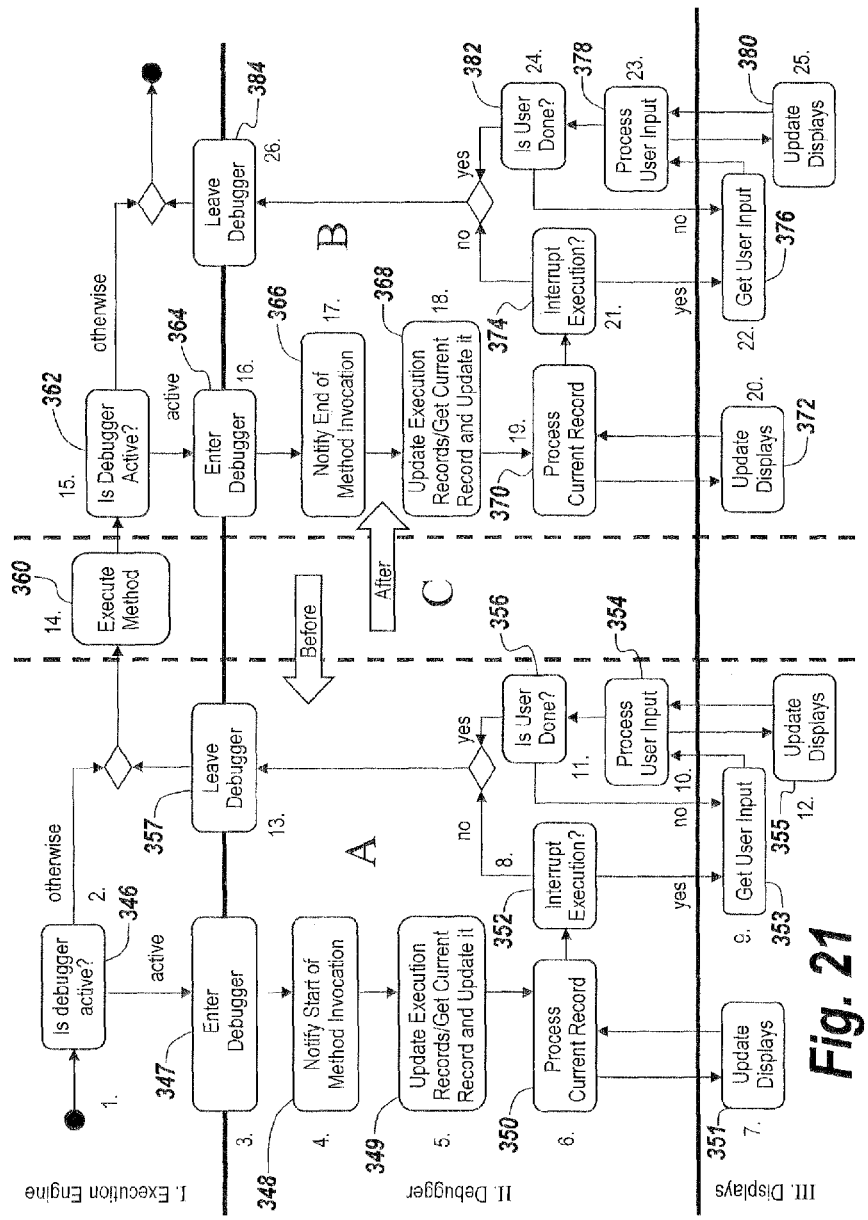
FIG. 21 is a flow chart of the sequence of steps followed by the illustrative embodiment of the present invention to structure the interaction of the displays, debugger and execution engine.

FIG. 21 is a flow chart of the sequence of steps followed by the illustrative embodiment of the present invention to structure the interactions between the displays, the debugger and the execution engine. Before the execution engine executes a method, a check occurs to see if the debugger is active or not (step 346). If the debugger is not active, the method is executed immediately (step 360), otherwise the execution enters the debugger (step 347). The execution engine sends the debugger the method id, the owner id and the attribute to notify the start of a method invocation (step 348). The debugger starts updating the execution records at the current record (step 349). If the state of the current record is "entered", the debugger searches the child records of the current record to find a record that has the same method id, attribute and owner id as the invocation about which the execution engine has notified the debugger. If it can find a record that matches the invocation, that record is set to be the current record and its state is set to "entering". If a matching record cannot be found, a new record is created and added to the child records of the current record. The new record is marked as current and its state is set to "entering". If the state of the current method is "exited", then the debugger searches for a record that matches the given owner id, method id and attribute among the child records of the parent record of the current record. If a matching record is found, it is set as the current record and its state is set to "entering". If a matching record is not found, a new record is created and added to the child records of the parent record of the current record and its state is set to "entering". The current record is set to be the newly created record.

Once the current record is determined, the record is processed (step 350) and the displays are updated (step 351). The debugger then checks to see if it needs to interrupt execution (step 352). One type of interruption is a breakpoint. The debugger goes through the list for breakpoints and tries to find a breakpoint that matches the current unique method invocation. If a breakpoint is detected, model simulation is interrupted and the debugger prompts the user for further input (step 353). User input such as setting breakpoints, analyzing data is processed (step 354) until the user specifies to continue simulation. The debugger updates the displays (step 355) and internal data as the user interacts with the debugger (step 354). Once the user is done (step 356) and the input processed, the debugger is exited (step 357), simulation is resumed and the method is executed (step 360). Before returning to the execution engine, the state of the current record is set to "entered".

After method execution (step 360), a determination is made as to whether the debugger is active (step 362). If is the debugger is active, execution enters the debugger (step 364). The execution engine notifies the debugger of the end of method invocation (step 366). The current record is updated (step 368), and the current record is processed (step 370). The state of the current record is set to "exiting" and the displays are updated (step 372). A check for interruption occurs (step 374) and if an interruption is detected, user input is retrieved (step 376) and processed (step 378). The displays are updated (step 380) and if the user is done (step 382), the model simulation is resumed after setting the state of the current record to "exited" and exiting the debugger (step 384). The sequence of steps is repeated for each method invocation in the simulation.

The debugger of the illustrative embodiment of the present invention keeps a look up table of colors for each block diagram method. For example, the outputs method for blocks may be assigned the color green. The debugger identifies the method in the current record and uses the method id and owner id to look up a color to display on the model view or the execution list view for the method being executed. The color is used to show which method is executing. The color is also used to color the text on the execution list view display of the record. It is used to color a small geometric region on the graphical representation of the owner on the model view.

The debugger also keeps another table of shapes and locations cross referenced with method types. The debugger uses the method and the owner to check the table holding the geometric shapes and locations in order to determine where to apply the color on the graphical representation of the method and in which geometry. The geometry can be anything such as rectangle or a circle. The geometric region is also used to calculate the arrows drawn for the visual pointer.

Figure 22:
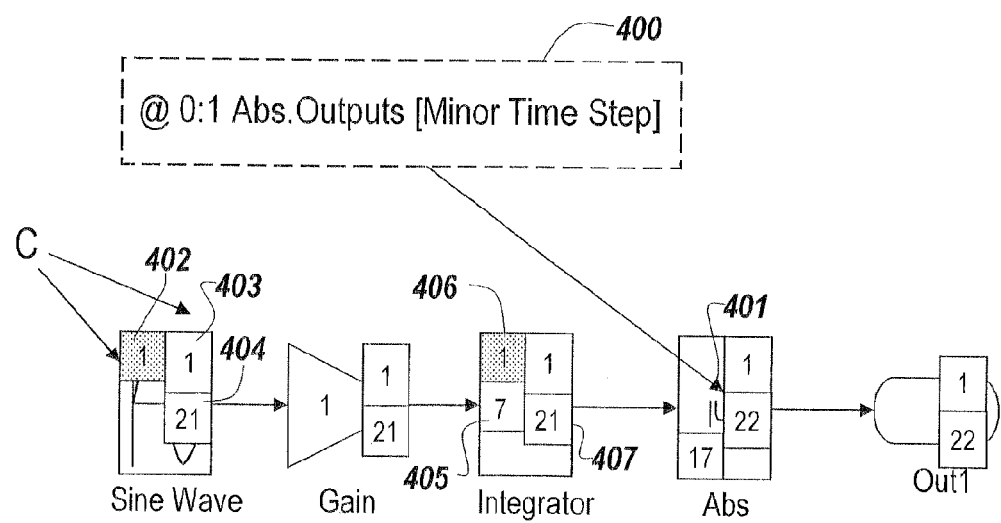
FIG. 22 depicts a block diagram showing the color coding of block diagram methods.

FIG. 22 depicts an implementation of method colors and the geometrical properties. The anchor 400 for the visual pointer is colored with the color of the currently executing method, Abs.Outputs (A). The arrow 401 is pointing at the top left corner of the geometric shape that represents the outputs method of the of the Abs block (B). The blocks have other geometric representations with different colors for different methods 402, 403, 404. Those skilled in the art will recognize that other visual indicators in addition to geometric shape and color may be used to convey information associated with a method.

The numbers on the blocks in FIG. 22 are profiling information about each method. 'Profiling information' relates to the number of times a certain method has executed so far in a given execution cycle. The illustrative embodiment of the present invention allows this information to be obtained by keeping a counter for each method and showing it next to each method of the block diagram in the tree view or by displaying the value of the counter on the related block in the model (either as a number or by some other graphical means). The counter may be reset to 0 at the start of every major time step.

On the records for each unique method invocation the following profiling data is stored:
1. The number of times a unique method invocation was invoked during model simulation. This is a counter that is incremented every time the unique method invocation occurs.
2. The number of times a unique method invocation was executed per time step of a model simulation. This is a counter that is incremented every time the unique method was invoked, but it is reset to zero at the start of each time step
3. The last time of entry to a unique method invocation. The debugger records the last time in the record of a unique method invocation before execution leaves the debugger and enters the execution engine.
4. The last time of exit from a unique method invocation. The debugger records the time the debugger is entered immediately after the method is executed.
5. The duration of method execution. This is the difference between time of last entry and last exit and is calculated immediately after last exit is recorded. This number can be the actual recent difference or an average of the past durations to accommodate any abnormal measurements.
6. The total duration of method execution. This record keeps the total time the execution engine spent executing this unique method invocation in real-time.

The profiling data that is collected is further processed to calculate the following:
1. The total number of times a method of a certain owner has been executed: The unique method invocations are traversed and the total number of times recorded for each record that has the specified owner and method is summed up. This information can be stored on the owner as a field as well.
2. The total of times a method of a certain owner has been executed in a time step: The unique method invocations are traversed and the total number of times per time step is recorded for each record that has the specified owner and the method is summed up. This information is stored on the owner as a field as well.
3. The total duration over a time step for a method of a certain owner: The duration of execution for each record with the given method and owner are summed up. This information is stored on the owner as a field as well.
4. The total duration for a method of a certain owner: The total duration of execution for each record with the given method and owner are summed up. This information is stored on the owner as a field as well.

The debugger merges profiling information with debug information for a block diagram by displaying the profiling information on the execution list view and/or the model view. On the execution list view, any of the recorded data is displayed. On the model view, any of the calculated data is displayed as numbers on the graphical representation of the owner. In FIG. 22, the number of times a method has executed in a time step is displayed inside the geometric shape that represents the method. For example, in FIG. 22, the Integrator block's Derivatives method 405 has executed seven times, Update method 406 has executed once, and the Outputs method 407 has executed twenty one times (Minor Time Step only) in the current time step of model simulation. The profiling data displays are dynamically updated as the debugging session continues.

The illustrative embodiment of the present invention provides the ability to simulate a model without user interaction until a particular point in the simulation is reached where detailed investigation is desired. This is achieved by means of 'breakpoints'. By setting a breakpoint somewhere in the execution trajectory, the debugger will halt when this point is reached in simulation and advance from that point only in response to user commands. For example, the user can specify to break on a unique method invocation, on the execution of all methods of an owner, on the execution of a specific method of an owner, or on the execution of a specific method of an owner at certain task id. In addition to setting breakpoints on the block diagram, the execution list view is also used to put breakpoints at displayed methods by right clicking on the execution list view and selecting the 'set breakpoint' option from the pop-up menu or by checking a checkbox next to the name of the method.

In addition to setting breakpoints at specific locations in the simulation, a breakpoint can also be set when specific conditions are met, a 'conditional breakpoint'. To set a conditional breakpoint, an expression (e.g. a MATLAB command) can be specified that halts execution when it evaluates to true. These conditional breakpoints can be extensive and sophisticated logical constructs including evaluations on debug information such as the number of times a point in the execution needs to be reached before halting execution. Additionally, the user can specify an object (a block, system or model) for which the expression should be checked, whether to check the expression before a specific method executes or after it executes for that object and the user can also specify the task id. In one example of implementation, the expression is in M (MATLAB's scripting language). The debugger calls into MATLAB to evaluate the expression and to check if the expression returns true. If the expression is true, the debugger interrupts the simulation of the model.

In addition to user defined conditions, the debugger can interrupt model execution when unexpected execution events, known as exceptions, occur. For instance, division by zero is an exception and the debugger interrupts the execution at that point to let the user analyze the model to see what caused the exception. Another exception is the failure for the numerical solvers to converge to a solution. The debugger interrupts the execution in this case again for the user to find the cause of the exception. Exceptions are treated as methods and unique method invocation records are created. The user can suppress the interruption of execution for each exception.

The user specifications of breakpoints are stored in a breakpoint structure. The breakpoint structure may have the following fields:
1. The owner id.
2. The method id
3. The task id's if applicable or all task id's.
4. The id of the record if the user specified a record to interrupt at.
5. An indicator to break before or after the execution of methods.
6. The expression if specified by the user or the exception type
7. Access to the graphical representation of this breakpoint on the model view Those skilled in the art will recognize that additional/other fields may also be contained within the breakpoint structure without departing from the scope of the present invention.

The user is also able to see data relevant to a block by specifying a trace point or a display point. A trace point is a request by the user to display block I/O, states and other information after any of the block's methods execute. A display point is a request by the user to see the same information every time after any method executes. The display and the trace point are stored in a structure with the following fields:
1. The identifier of the owner.
2. Access to the graphical representation of the display/trace point on the model view.

The debugger keeps lists for break, display and trace points.

Small icons may be placed on the blocks in the block diagram to show the user whether a breakpoint, display point or a trace point is set on them. The breakpoint icon changes color when the execution is interrupted at a breakpoint set on that block. Right clicking on the icons will show further information such as the exact breakpoint and current I/O variables. Besides, right clicking on a block inside the debugger will allow the user to set/unset a break, display or trace point on that block.

If a breakpoint specifies an owner or a record id of a record with an owner that has a graphical representation on the model view, a graphical mark is drawn on top or around this representation to mark the existence of a breakpoint related to the owner of that graphical representation. The mark is removed when the breakpoint is removed. For trace and display points the same action is taken. When the user sets a break/display/trace point, the debugger checks if an owner with a graphical representation has been specified. If a graphical representation is found, a special mark on or around the representation is drawn.

The mark for breakpoints can be colored with the color of the method if a method was specified when a breakpoint was set. If the debugger interrupts execution at a breakpoint that has a mark, the mark is colored differently and its shape is altered to indicate that it is the current breakpoint. The window containing the mark is brought to the top of the window stack on the screen. The user can right or left click on the marks and remove the display or breakpoints. When the user removes a break, display or trace point the corresponding mark is removed from the block diagram view.

Important parts of information in debugging a model are the values of state variables, the input and output of a block and other internal information. The illustrative embodiment of the present invention makes these values available by 'wrapping' a block diagram in a unified data dictionary (UDD) object and creating variables in the MATLAB workspace in the M language. It is the wrapping of the simulation-generated data such as states, block inputs and outputs and/or signal values that exposes it to other computation environment through an object for modification and inspection outside of the execution engine. The values may be changed through the UDD interface as well so the internal data of the block diagram can be altered. The data the UDD objects contain is dynamically updated as the simulation is in progress.

In one implementation, the user of the graphical debugger right or left clicks on a block and from a pop-up menu requests that the states, input and outputs are exported to the MATLAB workspace. The debugger creates a UDD object that contains access to the memory locations inside the execution engine where the data the user requested is stored. The debugger keeps a list of these objects for clean up and further processing as well as to check that the user does not create multiple UDD objects per block. The user can alter the block data inside the MATLAB computational environment and directly affect the progress and numerical output of model simulation. The UDD wrapper objects can be used in other MATLAB functions.

The UDD object checks that the values assigned by the user are correct and data is valid. For example, the user cannot assign a value of a certain data type to an incompatible data type. If the user specifies invalid data, an error is generated. The debugger destroys the UDD objects when the debugging session is closed. The user can request to destroy the objects by right or left clicking on a block that has a UDD object and choosing the menu item to destroy the object.

In addition to the information discussed above, the execution history of a block diagram may also be retrieved. In particular, the user may obtain the order, and start and stop time of each method executed during simulation. As each method is entered or exited, text is printed out to the command line (or any other modality such as a file), containing the time of entry or exit and the name of the method. The information may also be obtained as a workspace variable instead of in a textual format. This information can be saved and used to compare multiple runs of a block diagram to find simulation differences resulting from any changes to the block diagram. A tool may be created to automatically compare and identify the differences.

The illustrative embodiment of the present invention prints out the method name, the owner name, and time of entry to the method when the current record is determined. The debugger prints out a message indicating the entry to the method. The debugger also prints out the same information when the simulation enters the debugger after a method executes with a message indicating that it is the exit from the method. Other information such as profiling information can also be printed out at exit from a method. Instead of printing out messages to the user interfaces, the messages may be printed to a file or the same information printed can be saved in a file for further processing.

In FIG. 23, an execution history 420 is shown. The time of entry and exit to each method, the record id of each method, the owner id of each method and the method id are printed out to the user interface.

The model view that the user edits and is saved in the model file is the normal view of the model seen by the user. The execution engine may add hidden blocks or remove blocks and alter the topology represented by the normal view during model compilation for optimization and other purposes. This altered topology is the compiled view. The illustrative embodiment of the present invention allows the reductions that occurred as well as elements and/or blocks that have been added to be shown as graphical annotations on the normal view. The topology of the normal view is then altered in debug mode to show the compiled view, which may then be saved if so desired by the user.

The debugger gets the locations of the added hidden blocks from the execution engine. The connectivity of the hidden blocks are known, that is the debugger identifies from the execution engine the blocks to which the hidden block is connected. The debugger edits the model view and programmatically inserts a visible block that satisfies the connectivity requirements of the compiled view of the model. Before the model view is edited, it is stored so that at the end of debugging, the unchanged model view can be restored. This block graphically represents the inserted hidden block. The user can interact with this block like any other block.

The debugger may automatically and graphically indicate the list of blocks that are a part of an algebraic loop when execution of the model is processing that algebraic loop. The connections between the blocks are colored differently to denote the algebraic loop.

All of the graphical annotations such as breakpoint, display point or trace point marks as well as profiling information may be displayed on inserted visible blocks generated by the compile process. Removed blocks can be erased from the model view or they can be colored with a special color to indicate that they have been removed from the block diagram and that they do not have any methods that will execute. The compiled view of the model can be saved like a regular user model for further use.

The illustrative embodiment of the present invention allows the debugger to be enabled not only at the start of model simulation, but also during simulation. By selecting a control button on the model viewer during model simulation the debugger will be activated. The model may or may not suspend the simulation at that time. When the user starts simulation outside the debug mode, the debugger only creates and updates the records of unique method invocations. It does not check interruptions, it does not update displays and the debugger user interfaces are not available to the user. If desired by the user, profiling information is updated. After determining the current record or updating it, an early return is made back to the execution engine. If during simulation of the block diagram, the user enables the debugger, the user interfaces are revealed to the user. The debugger does not do an early return. Full functionality is available to the user.

The debugger can save snapshots of model execution. The user can save the execution data to a file at any time during debugging or the debugger can be setup to take snapshots of the simulation at regular or user defined intervals. The user can load these snapshots to start a debugging session at a given point in the execution history, e.g., two seconds of simulated time before the present point. The user can navigate through multiple snapshots in increasing or decreasing simulation time order to analyze the execution of the model without restarting the execution of the model.

The illustrative embodiment of the present invention enables the debugger to identify problems in the compiled mode of execution of the block diagram. The standalone executable is instrumented with additional code so that it can send messages and accept commands from the block diagram debugger. The debugger acquires data to display on the block diagram from the standalone executable instead of the execution engine. The debugger controls the standalone executable.

A standalone executable may be created from a block diagram that runs the model outside the execution engine. This is the compiled mode of the simulation of a model. The graphical debugger can display information about the execution of the standalone executable if the executable is instrumented to supply the debugger required pieces of information.

Figure 24:
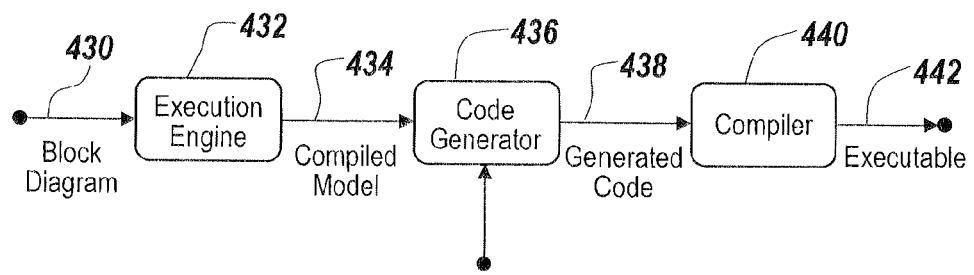
FIG. 24 depicts a block diagram showing the instrumentation process for compiled mode of simulation.

FIG. 24 illustrates the process of creating a standalone executable for debugging. The block diagram 430 is first loaded and processed 432 by the execution engine to obtain the compiled model information 434. The code generator 436 processes the compiled model information 434 to create code 438 in a specified programming language. The additional code required for debugging is injected into the process. The injection of code to instrument the auto generated code can be used for debugging, profiling or any other special code generation need. In this case, it is used for debugging the executable. The injected code is responsible for notifying the debugger of method entry and exit as well as supplying run-time information to the debugger about the simulation. The injected code sends to the block diagram debugger, the method id, the owner id and the attribute, as well as whether there is an entry or an exit to the method. The injected code receives commands in return to resume or continue execution. The generated code (which includes the injected code) is compiled by the compiler 440 and turned into an executable 442. The standalone executable 442 can send run-time information to debugger on request. It can log the execution history to a file in different formats.

The generated code is compiled into a standalone executable and the executable is deployed. The standalone executable communicates with the debugger through an external mode simulation. The standalone executable and the debugger do not have to be on the same computer. For communication, a computer network connection or any other communication connection is sufficient.

The standalone executable can be started with the debugger or the debugger can attach to a standalone executable while the executable is running similar to interpreted mode. In the latter case, the debugger first interrupts the execution of the standalone application and parses the execution history log file to create the execution list view until that moment in the execution history. The block diagram debugger displays the information sent from the executable on the model view of the block diagram similar to debugging a block diagram in interpreted mode. The executable sends the method id, owner id and the attribute to the debugger. The debugger creates and updates the records of unique method invocations, similar to interpretive mode. The debugger checks for any breakpoints or for requests to interrupt for execution. If necessary, the debugger sends a request to obtain run-time information for trace and display points. All graphical annotations are shown on the diagram such as break/display/trace points. The visual pointer is drawn and the execution list view is created.

The illustrative embodiment of the present invention provides a control that can be manipulated by the user to control the simulation of the model during debugging. The graphical implementation of the control to set the delay can be a slider bar, a dial, and a text box to write the actual delay time. The user sets a parameter through the control and may then step through the simulation of the block diagram at a specified rate in real-time during debugging. This enables the users to follow the simulation of the block diagram at a pace of their choice through the user interfaces. The debugger checks for changes in delay time every time the debugger is entered before a method is executed. The debugger pauses an amount equal to the delay time before model simulation resumes and a method is executed The illustrative embodiment of the present invention allows debugging information to be exposed to a user in viewing the model view in a number of ways. As a mouse or other pointing device hovers over a signal line or a block, the tool tip of the pointer is exploited to display text that contains the current input, output, state values and other information of a block or the current value of a signal and its update time. By pressing a control key, the text field can be made persistent (i.e., prevent it from vanishing when the mouse pointer is moved) and remain visible till a reverting control action is executed. If the persistent display is created for a block, a display point by the debugger is put on the block and block data such as input, output, states and other block information is displayed. Means to close the text field with a mouse is supplied. If the text box is made persistent for a signal, the value of the signal is displayed. Additional data such as data type or last time of update may also be displayed. Similarly to the block text box, means to close the text field with a mouse is supplied for a text box created for a signal. The user can choose multiple blocks and signals by specifying an area on the model view. When the user invokes an interface, texts for all blocks and signals are created.

Figure 25:
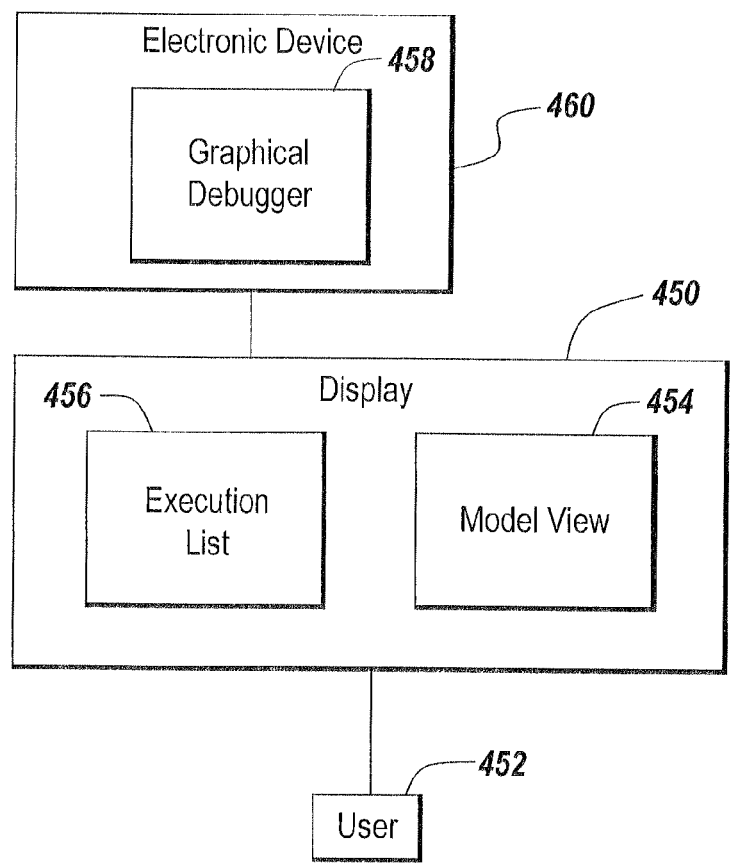
FIG. 25 depicts a block diagram of the display environment of the illustrative embodiment of the present invention.

The display environment of the illustrative embodiment of the present invention may be seen in FIG. 25. A display 450 is viewed by a user 452. The display includes both a model view 454 and an execution list view 456. The current status of the execution list view 456 is visually indicated on the model view 454 in the various manners discussed above. Those skilled in the art will recognize that the execution list view may cover part or all of the model view and that the location of the two views on the display is immaterial to the present invention. Similarly, the two views may be displayed separately as well as together without departing from the scope of the present invention. The display 450 is connected to an electronic device 460 which holds the graphical debugger 458.

Since certain changes may be made without departing from the scope of the present invention, it is intended that all matter contained in the above description or shown in the accompanying drawings be interpreted as illustrative and not in a literal sense. Practitioners of the art will realize that the system configurations depicted and described herein are examples of multiple possible system configurations that fall within the scope of the current invention. For example, the present invention may be practiced in other block diagram simulation environments such as text based simulation environments. Likewise, the sequence of steps utilized in the illustrative flowcharts are examples and not the exclusive sequence of steps possible within the scope of the present invention.

We claim:

1. A non-transitory computer-readable storage medium storing instructions, the instructions comprising:
   instructions that, when executed by a processor, cause the processor to:
      interact with a computer-based modeling application, where:
         the computer-based modeling application supports a plurality of environments,
         the computer-based modeling application executes a model comprising a block, and
         the block calls a first block method, the first block method:
            performing operations on behalf of the block when the first block method executes,
            being represented in code generated from the model,
            operating in a first environment of the computer-based modeling application, and
            being identified using a graphical debugger that is interfaced with the first environment while the model executes;
      identify the block that calls the first block method as an owner block of the first block method;
      form a logical association between the first block method and the owner block;
      display, using the graphical debugger while the model executes:
         the owner block in a model view of the graphical debugger,
         the first block method in an execution list view of the graphical debugger, the model view and the execution list view being presented together in the graphical debugger, and
         a visual indication of the logical association between the first block method and the owner block.

2. The medium of claim 1, wherein the first block method is identified by:
   identifying the first block method using a first block method name; and
   displaying the first block method name.

3. The medium of claim 2, wherein the forming of the logical association between the first block method and the owner block comprises:
   generating a hyperlink from the displayed first block method name to the owner block.

4. The medium of claim 1, wherein the instructions further comprise:
   instructions that, when executed by the processor, cause the processor to:
      display a name of the first block method in a display;
      receive a selection of the first block method; and
      graphically indicate the owner block.

5. The medium of claim 4, wherein the graphically indicating the owner block comprises at least one of highlighting the owner block in the display, marking the owner block with a color, or giving focus to a window displaying the owner block.

6. The medium of claim 4, wherein the graphically indicating the owner block comprises:
   searching, with the graphical debugger, for the owner block;
   identifying the owner block; and
   using the graphical debugger to call a locating method of the owner block to access a location or properties of a graphical representation of the owner block.

7. The medium of claim 1, wherein the instructions further comprise:
   instructions that, when executed by the processor, cause the processor to:
   display the first block method using a display;
   receive a selection of the owner block; and
   graphically distinguish the first block method.

8. The medium of claim 1, wherein the instructions further comprise:
   instructions that, when executed by the processor, cause the processor to:
   determine whether the computer-based modeling application should execute the model in a single task simulation loop or a multi-task simulation loop, the model having blocks wherein:
   the model is executed in the single task simulation loop if the model is a single rate system wherein the sample time for each of the blocks is the same, and
   the model is executed in the multi-task simulation loop if the model is a multi-rate system wherein at least one sample time for at least one of the blocks is different from at least one sample time for another one of the blocks; and
   execute the model using the single task simulation loop or the multi-task simulation loop.

9. The medium of claim 1, wherein the identifying of the block that calls the first block method is performed using debug information related to the execution of the model.

10. The medium of claim 1, wherein the first environment is one of a text-based environment, a time-based block diagram environment, a state-based block diagram environment, or a data-flow diagram environment.

11. The medium of claim 10, wherein the instructions further comprise:
    instructions that, when executed by the processor, cause the processor to:
    receive an identification of a second block method operating in a second environment, where the second environment differs from the first environment and is interfaced with the graphical debugger.

12. The medium of claim 11, wherein the instructions further comprise:
    instructions that, when executed by the processor, cause the processor to:
    generate, using the graphical debugger, output information for a user or for a destination, the output information identifying:
    when the first block method or the second block method are operating,
    an operation performed by the first block method or the second block method at a determined location in the first block method or the second block method, or
    an error related to the first block method or the second block method during execution of the model.

13. A computer-implemented method comprising:
    interacting with a computer-based modeling application, where:
    the computer-based modeling application executes a model comprising a block,
    the computer-based modeling application includes a first environment,
    the block includes a first block method,
    the first block method performs operations on behalf of the block when the first block method executes,
    the first block method is represented in code generated from the model,
    the first block method operates in the first environment, and
    the computer-based modeling application is executed using a computing device;
    interfacing a graphical debugger with the first environment;
    identifying the first block method operating in the first environment, the identifying performed:
    using the graphical debugger, and
    while the model executes;
    identifying the block that includes the first block method as an owner block of first block method;
    forming a logical association between the first block method and the owner block; and
    displaying, using the graphical debugger while the model executes:
    the owner block in a model view of the graphical debugger,
    the first block method in an execution list view of the graphical debugger, the model view and the execution list view being presented in the graphical debugger, and
    a visual indication of the logical association between the first block method and the owner block.

14. The method of claim 13, wherein identifying the first block method comprises:
    identifying the first block method using a first block method name; and
    displaying the first block method name.

15. The method of claim 14, wherein the forming of the logical association between the first block method and the owner block comprises:
    generating a hyperlink from the displayed first block method name to the owner block.

16. The method of claim 13, further comprising:
    displaying a name of the first block method using a display;
    receiving a selection of the first block method; and
    graphically distinguishing the owner block from other blocks on the display.

17. The method of claim 13, wherein the displaying of the visual indication of the logical association comprises at least one of highlighting the owner block in the display, marking the owner block with a color, or giving focus to a window displaying the owner block.

18. The method of claim 13, wherein the displaying of the visual indication of the logical association comprises:
    searching, with the graphical debugger, for the owner block;
    identifying the owner block using the graphical debugger;
    using the graphical debugger to call a locating method of the owner block; and
    accessing a location or properties of a graphical representation of the owner block based on the using.

19. The method of claim 13, further comprising instructions for:

displaying the first block method using a display;
receiving a selection of the owner block; and
graphically distinguishing the first block method from other block methods on the display.

20. A non-transitory computer-readable storage medium storing instructions, the instructions comprising:
  instructions that, when executed by a processor, cause the processor to:
    interact with a computer-based modeling application, where:
      the computer-based modeling application supports an environment,
      the computer-based modeling application executes a model comprising a block, and
      the block is associated with execution data, the execution data:
        being created on behalf of the block when the block executes, and
        being identified using a graphical debugger that is interfaced with the environment while the model executes;
    display, using the graphical debugger while the model executes:
      the block in a model view of the graphical debugger, and
      the execution data in an execution list view of the graphical debugger, the model view and the execution list view being presented together in the graphical debugger.

21. The medium of claim 20, wherein the execution data is one or more of a state of the block, a value of a variable used by the block, a derivative, an input to the block, and an output from the block.

* * * * *

UNITED STATES PATENT AND TRADEMARK OFFICE
CERTIFICATE OF CORRECTION

| | | |
|---|---|---|
| PATENT NO. | : 9,104,805 B1 | Page 1 of 1 |
| APPLICATION NO. | : 13/408463 | |
| DATED | : August 11, 2015 | |
| INVENTOR(S) | : Yunt et al. | |

It is certified that error appears in the above-identified patent and that said Letters Patent is hereby corrected as shown below:

In the Specification:
Col. 37, line 48 should read:
the model view. When the user invokes an interface, display texts for Signed and Sealed this
Third Day of May, 2016

Michelle K. Lee
*Director of the United States Patent and Trademark Office*